United States Patent
Lee et al.

(10) Patent No.: US 11,545,733 B2
(45) Date of Patent: Jan. 3, 2023

(54) ANTENNA MODULE INCLUDING FLEXIBLE PRINTED CIRCUIT BOARD AND ELECTRONIC DEVICE INCLUDING THE ANTENNA MODULE

(71) Applicant: Samsung Electronics Co., Ltd., Suwon-si (KR)

(72) Inventors: Juneseok Lee, Suwon-si (KR); Junsig Kum, Suwon-si (KR); Kwanghyun Baek, Suwon-si (KR); Dohyuk Ha, Suwon-si (KR); Jinsu Heo, Suwon-si (KR); Youngju Lee, Suwon-si (KR); Jungyub Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 225 days.

(21) Appl. No.: 16/793,360

(22) Filed: Feb. 18, 2020

(65) Prior Publication Data

US 2020/0266519 A1 Aug. 20, 2020

Related U.S. Application Data

(60) Provisional application No. 62/807,903, filed on Feb. 20, 2019.

(30) Foreign Application Priority Data

Mar. 29, 2019 (KR) .......................... 10-2019-0036901

(51) Int. Cl.
*H01Q 1/22* (2006.01)
*H01Q 1/24* (2006.01)
(Continued)

(52) U.S. Cl.
CPC ............ *H01Q 1/2283* (2013.01); *H01Q 1/243* (2013.01); *H01Q 9/0435* (2013.01); *H01Q 9/42* (2013.01); *H04B 7/0617* (2013.01); *H05K 1/189* (2013.01)

(58) Field of Classification Search
CPC ...... H01Q 21/29; H01Q 21/28; H01Q 9/0457; H01Q 21/24; H01Q 21/061–065;
(Continued)

(56) References Cited

U.S. PATENT DOCUMENTS

| | | | |
|---|---|---|---|
| 10,084,241 B1 | 9/2018 | Jenwatanavet et al. | |
| 2010/0219513 A1* | 9/2010 | Zhang | H01Q 1/38 257/659 |

(Continued)

OTHER PUBLICATIONS

Extended European Search Report dated Jun. 25, 2020, issued in European Application No. 20158279.8.

*Primary Examiner* — Ricardo I Magallanes
(74) *Attorney, Agent, or Firm* — Jefferson IP Law, LLP

(57) ABSTRACT

The disclosure relates to a communication method and system for converging a 5th-Generation (5G) communication system for supporting higher data rates beyond a 4th-Generation (4G) system with a technology for Internet of Things (IoT). The disclosure may be applied to intelligent services based on the 5G communication technology and the IoT-related technology, such as smart home, smart building, smart city, smart car, connected car, health care, digital education, smart retail, security and safety services. An antenna module is provided. The antenna module includes a flexible printed circuit board (FPCB) including a first surface directed in a first direction and a second surface directed in a second direction that forms a predetermined first angle with respect to the first direction, a first antenna deployed on one surface of the first surface, and a second antenna deployed on one surface of the second surface.

18 Claims, 26 Drawing Sheets

(51) Int. Cl.
*H01Q 9/04* (2006.01)
*H05K 1/18* (2006.01)
*H01Q 9/42* (2006.01)
*H04B 7/06* (2006.01)

(58) Field of Classification Search
CPC ........ H01Q 5/40; H01Q 1/2283; H01Q 9/045; H05K 1/189; H05K 1/118; H05K 1/147
See application file for complete search history.

(56) References Cited

U.S. PATENT DOCUMENTS

| | | |
|---|---|---|
| 2016/0308287 A1 | 10/2016 | Kamgaing et al. |
| 2018/0026341 A1 | 1/2018 | Mow et al. |
| 2018/0159203 A1* | 6/2018 | Baks .................... H01Q 21/065 |
| 2018/0233808 A1 | 8/2018 | Noori et al. |
| 2018/0301791 A1 | 10/2018 | Jin et al. |
| 2019/0288402 A1* | 9/2019 | Rashidian ................ H01Q 1/38 |
| 2020/0028251 A1* | 1/2020 | Shimura ................ H05K 1/165 |
| 2021/0242569 A1* | 8/2021 | Fujii ...................... H05K 3/361 |

\* cited by examiner

ANTENNA MODULE INCLUDING FLEXIBLE PRINTED CIRCUIT BOARD AND ELECTRONIC DEVICE INCLUDING THE ANTENNA MODULE

CROSS-REFERENCE TO RELATED APPLICATION(S)

This application is based on and claims priority under 35 U.S.C. § 119(e) of a U.S. Provisional application Ser. No. 62/807,903, filed on Feb. 20, 2019, in the U.S. Patent and Trademark Office, and under 35 U.S.C. § 119(a) of a Korean patent application number 10-2019-0036901, filed on Mar. 29, 2019, in the Korean Intellectual Property Office, the disclosure of which is incorporated by reference herein in its entirety.

BACKGROUND

1. Field

The disclosure relates to an antenna module including a flexible printed circuit board and an electronic device including the antenna module.

2. Description of Related Art

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4th generation (4G) Network' or a 'Post Long Term Evolution (LTE) System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid frequency shift keying (FSK) and quadrature amplitude modulation (QAM) (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud RAN as the above-described Big Data processing technology may also be considered to be as an example of convergence between the 5G technology and the IoT technology.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a structure for efficiently deploying antennas in a limited space inside the electronic device.

In a 5G mobile communication system, beamforming techniques may be operated in order to mitigate a path loss of radio waves in a high frequency band and to increase a transfer distance of the radio waves. Meanwhile, in order to form beams in various directions, the number of antennas deployed inside an electronic device should be increased.

Further, various structures (e.g., metals) that may deteriorate the radio waves may be included inside the electronic device. Accordingly, in order to form beams in various directions in the electronic device, it is necessary to deploy antennas in a plurality of locations inside the electronic device.

Additional aspects will be set forth in part in the description which follows and, in part, will be apparent from the description, or may be learned by practice of the presented embodiments.

In accordance with an aspect of the disclosure, an antenna module is provided. The antenna module includes a flexible printed circuit board (FPCB) including a first surface directed in a first direction and a second surface directed in a second direction that forms a predetermined first angle with respect to the first direction, a first antenna deployed on one surface of the first surface and configured to form a first radiation region in a third direction, and a second antenna deployed on one surface of the second surface and configured to form a second radiation region in a fourth direction.

In accordance with another aspect of the disclosure, an electronic device is provided. The electronic device includes a front member directed in a first direction, a rear member directed in a second direction that is opposite to the first direction, a side member surrounding a space between the front member and the rear member, and an antenna module deployed in a closed space formed by the front member, the rear member, and the side member, wherein the antenna module includes a flexible printed circuit board (FPCB) including a first surface facing the front member and a second surface facing the side member, a first antenna deployed on one surface of the first surface and configured to form a first radiation region in a third direction, and a second antenna deployed on one surface of the second surface and configured to form a second radiation region in a fourth direction.

In accordance with another aspect of the disclosure, an antenna module is provided. The antenna module includes a flexible printed circuit board (FPCB) including a first surface directed in a first direction and a second surface directed in a second direction that forms a predetermined first angle with respect to the first direction, a first antenna deployed on one surface of the first surface and configured to form a first radiation region in a third direction, a second antenna deployed on one surface of the second surface and configured to form a second radiation region in a fourth direction, a wireless communication chip deployed on the other surface of the flexible printed circuit board and configured to supply a radio frequency signal to the first antenna and the second antenna, and a modem configured to transmit a baseband signal to the wireless communication chip, wherein the modem is configured to transmit a control signal for beamforming to the wireless communication chip, and the wireless communication chip is configured to transmit a radio frequency signal to the first antenna and the second antenna based on the control signal.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
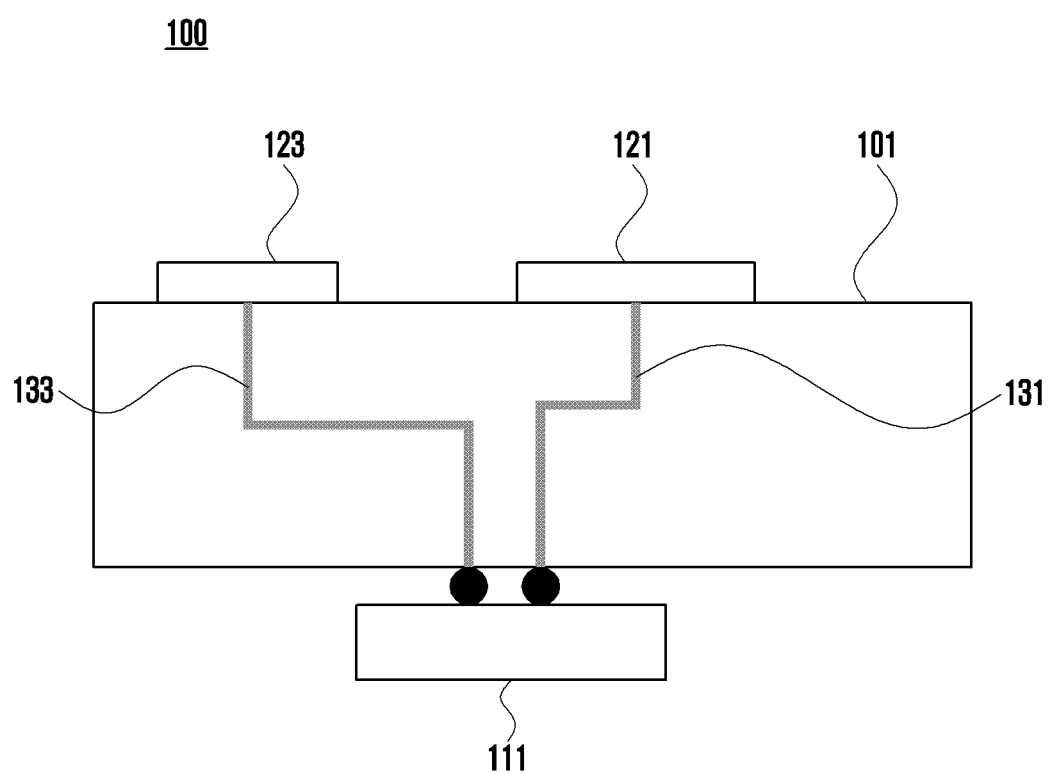
FIG. 1 is a diagram illustrating the structure of an antenna module according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In explaining embodiments of the disclosure, explanation of technical contents that are well known in the art to which the disclosure pertains and are not directly related to the disclosure will be omitted. This is to transfer the subject matter of the disclosure more clearly without obscuring the same through omission of unnecessary explanations.

For the same reason, in the accompanying drawings, sizes and relative sizes of some constituent elements may be exaggerated, omitted, or briefly illustrated. Further, sizes of the respective constituent elements do not completely reflect the actual sizes thereof. In the drawings, the same drawing reference numerals are used for the same or corresponding elements across various figures.

The aspects and features of the disclosure and methods for achieving the aspects and features will be apparent by referring to the embodiments to be described in detail with reference to the accompanying drawings. However, the disclosure is not limited to the embodiments disclosed hereinafter, and it can be implemented in diverse forms. The matters defined in the description, such as the detailed construction and elements, are only specific details provided to assist those of ordinary skill in the art in a comprehensive understanding of the disclosure, and the disclosure is only defined within the scope of the appended claims. In the entire description of the disclosure, the same drawing reference numerals are used for the same elements across various figures.

In this case, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the functions specified in the flowchart block or blocks.

Also, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

In this case, the term "~unit", as used in an embodiment, means, but is not limited to, a software or hardware component, such as field-programmable gate array (FPGA) or application-specific integrated circuit (ASIC), which performs certain tasks. However, "~unit" is not meant to be limited to software or hardware. The term "~unit" may advantageously be configured to reside on the addressable storage medium and configured to execute on one or more processors. Thus, "~unit" may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and "~units" may be combined into fewer components and "~units" or further separated into additional components and "~units". Further, the components and "~units" may be implemented to operate one or more central processing units (CPUs) in a device or a security multimedia card. Further, in an embodiment, "~unit" may include one or more processors.

FIG. 1 is a diagram illustrating the structure of an antenna module according to an embodiment of the disclosure.

Referring to FIG. 1, an antenna module 100 may include a printed circuit board (PCB) 101 on which at least one layer is laminated, a first antenna 121 deployed on an upper end surface of the printed circuit board 101, a second antenna 123 deployed spaced apart for a predetermined distance from the first antenna 121 on the upper end surface of the printed circuit board, a wireless communication chip 111 deployed on a lower end surface of the printed circuit board 101, a first feeding line 131 configured to electrically connect the wireless communication chip 111 and the first antenna 121 to each other in the printed circuit board 101, and a second feeding line 133 configured to electrically connect the wireless communication chip 111 and the second antenna 123 to each other in the printed circuit board 101.

According to the related art, it is difficult to deploy an antenna on a side surface of the printed circuit board 101. More specifically, a space enough to deploy antennas therein can be secured on the upper end surface or the lower end surface of the printed circuit board 101, and referring to FIG. 1, the first antenna 121 and the second antenna 123 can be deployed on the upper end surface of the printed circuit board 101. In contrast, the side surface of the printed circuit board 101 is so configured that a plurality of layers are laminated thereon, and thus it is difficult to form a feeding line on the side surface of the printed circuit board 101, and there is no sufficient space for deploying the antennas therein.

According to the related art, in order to deploy the antennas on the side surface of the printed circuit board 101, a sufficient space should be secured on the side surface of the printed circuit board 101 by increasing the number of layers laminated in the printed circuit board 101. In addition, in order to form feeding lines on the side surface of the printed circuit board 101, separate feeding lines may be required.

In a 5G mobile communication system using a high frequency band, an antenna module structure in which antennas are deployed on the side surface of the printed circuit board 101 may be required. The antenna module structure required in the 5G mobile communication system will be described later with reference to FIG. 2.

Figure 2:
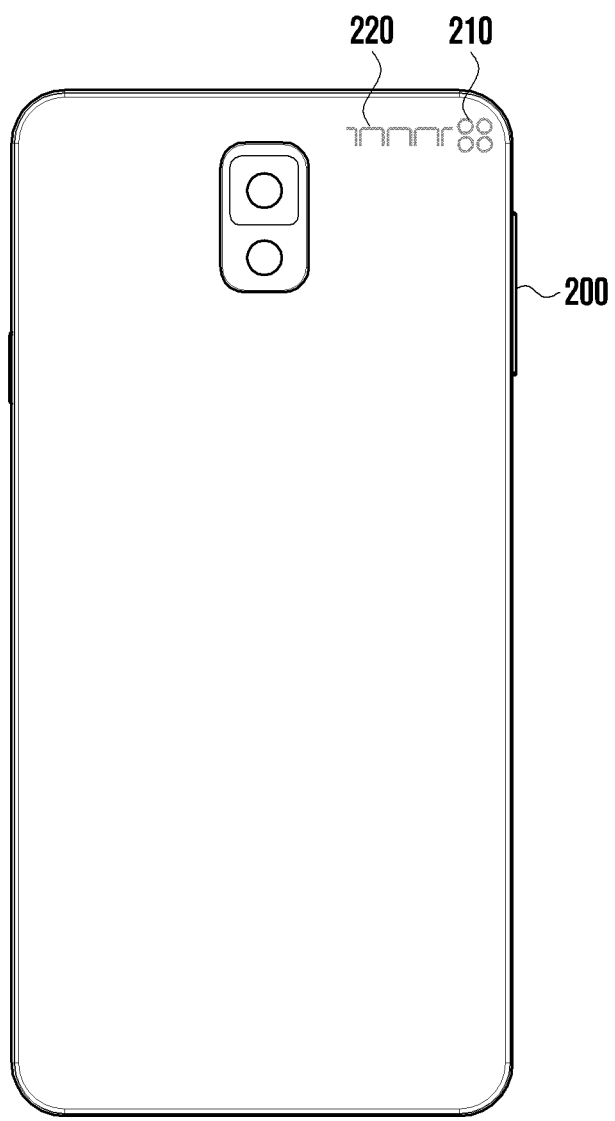
FIG. 2 is a diagram illustrating an antenna module deployed within an electronic device according to an embodiment of the disclosure.

FIG. 2 is a diagram illustrating an antenna module deployed within an electronic device according to an embodiment of the disclosure.

Referring to FIG. 2, an electronic device (e.g., terminal or laptop) 200 may include a first antenna group 210 capable of radiating radio waves to a front plate or a rear plate of the electronic device and a second antenna group 220 capable of radiating radio waves to the side surface of the electronic device 200.

According to the related art, the upper end surface of the printed circuit board deployed inside the electronic device 200 may face the front plate or the rear plate of the electronic device. Meanwhile, from the viewpoint of the antenna performance and the usage of an inner space of the electronic device, it is preferable to deploy the second antenna group 220 radiating the radio waves to the side surface of the electronic device 200 on the side surface of the printed circuit board deployed inside the electronic device 200.

In particular, in the 5G mobile communication system using the high frequency band, the number of antennas deployed on the inside cannot help being increased to form beams in various directions. Accordingly, if it is assumed that antennas are unable to be deployed on the side surface of the printed circuit board in the electronic device using the 5G mobile communication system, the space in which the antennas can be deployed inside the electronic device cannot help being narrowed.

Although FIG. 2 illustrates only a case where the first antenna group 210 includes four antennas and the second antenna group 220 includes four antennas, 16 or more antennas may be deployed in each of the first antenna group 210 and the second antenna group 220 in the 5G mobile communication system. That is, there is a need for an efficient antenna module structure for deploying a large number of antennas in an electronic device to which the 5G mobile communication system is applied. Accordingly, an antenna module structure capable of efficiently deploying antennas will be hereinafter disclosed.

Figure 3:
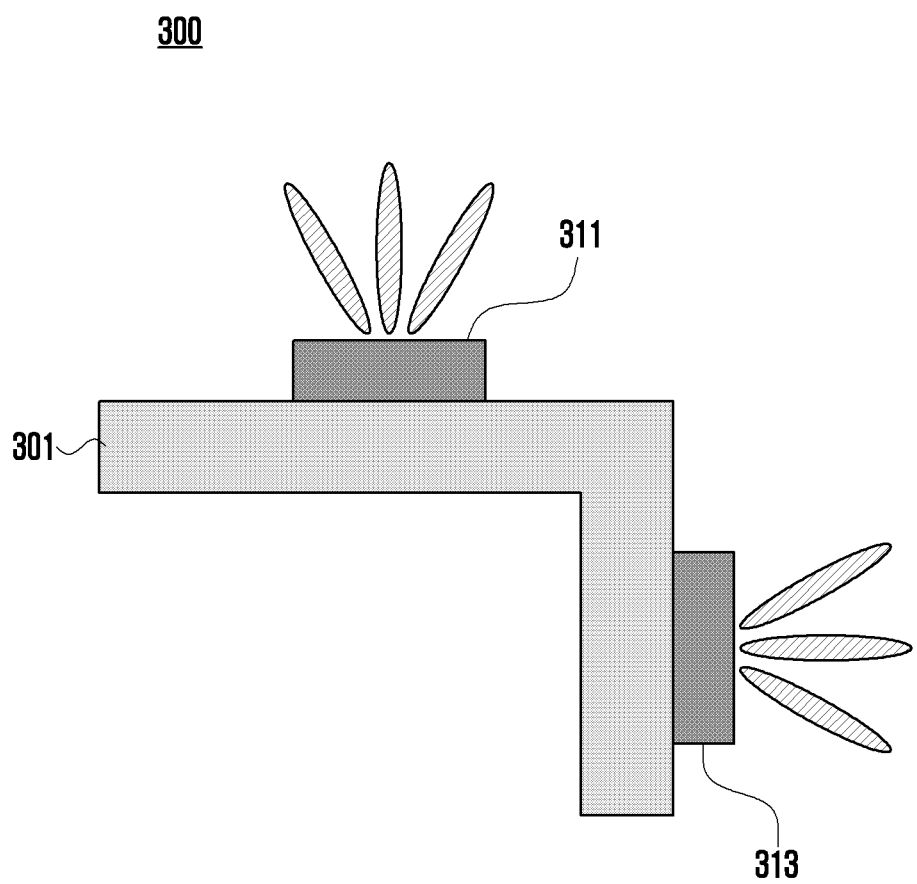
FIG. 3 is a diagram illustrating the structure of an antenna module in which antennas are deployed on a flexible printed circuit board according to an embodiment of the disclosure.

FIG. 3 is a diagram illustrating the structure of an antenna module in which antennas are deployed on a flexible printed circuit board according to an embodiment of the disclosure.

Referring to FIG. 3, an antenna module 300 may include a flexible printed circuit board (FPCB) 301 including a first surface directed in a first direction and a second surface directed in a second direction that forms a predetermined first angle with respect to the first direction, a first antenna 311 deployed on one surface of the first surface and configured to form a first radiation region in a third direction, and a second antenna 313 deployed on one surface of the second surface and configured to form a second radiation region in a fourth direction. According to various embodiments, the flexible printed circuit board may be bent or folded by an external force.

According to an embodiment, the antenna module 300 may be included inside an electronic device. According to various embodiments, in the case where the antenna module 300 is mounted inside the electronic device, the first direction may be a direction of a front plate or a rear plate of the electronic device, and the first antenna 311 deployed on the first surface may perform beamforming in the direction of a front or rear surface of the electronic device.

According to an embodiment, in the case where the antenna module 300 is mounted inside the electronic device, the second direction may be a direction of a side surface of the electronic device, and the second antenna 313 deployed on the second surface may perform beamforming in the direction of the side surface of the electronic device. The first antenna 311 may be a broadside antenna of the electronic device, and the second antenna 313 may be an endfire antenna of the electronic device.

According to an embodiment, a partial region of a region that forms the first radiation region may overlap a partial region of a region that forms the second radiation region, and the partial region of the region that forms the first radiation region may not overlap the partial region of the region that forms the second radiation region.

According to an embodiment, the antenna module 300 may include a controller (not illustrated) electrically connected to the first antenna 311 and the second antenna 313 and configured to control radiation directions of radio waves being radiated through the first antenna 311 and the second antenna 313. According to various embodiments, the controller may be deployed on a lower end surface of the flexible printed circuit board 301. For example, the controller may be included in a wireless communication chip deployed on the lower end surface of the flexible printed circuit board.

According to an embodiment, the first antenna 311 and the second antenna 313 included in the antenna module 300 may be deployed on an upper end surface of the same flexible printed circuit board 301, and in accordance with the bending or folding of the flexible printed circuit board 301, the direction in which the first antenna 311 performs beamforming and the direction in which the second antenna 313 performs beamforming may differ from each other. According to various embodiments, two or more antennas performing beamforming in different directions may be deployed on one flexible printed circuit board 301 even without adding a separate layer.

According to an embodiment, the first antenna 311 and the second antenna 313 may include at least one of a patch antenna, a monopole antenna, a spiral antenna, a wave antenna, a yagiuda antenna, a loop antenna, a Vivaldi antenna, or a holographic antenna.

According to an embodiment, the patch antenna may be small and light, may be easily arrayed, and may be easily integrated onto a printed circuit board or a flexible printed circuit board. Further, polarization of the patch antenna may be easily adjusted. According to various embodiments, the patch antenna may be suitable to a printed circuit board or a flexible printed circuit board having low permittivity and great thickness.

According to an embodiment, the dipole antenna may be in the shape in which a feeding line is connected between two conductor rods. According to various embodiments, the dipole antenna may be used for high frequency or very high frequency.

According to an embodiment, the monopole antenna may be in the shape of a straight line, and it may have a structure in which a ground that is not a conductor is deployed on one side. According to various embodiments, the monopole antenna may have a shorter length than the length of the dipole antenna, and it may be a non-directional antenna. For example, the monopole antenna may be used for a mobile communication terminal or frequency modulation (FM) radio receiver equipment.

According to an embodiment, the loop antenna may be a directional antenna, and it may be used in the field in which antenna efficiency is not so important as a signal-to-noise ratio. According to various embodiments, the loop antenna may be used as a direction finding antenna or a probe antenna.

According to an embodiment, the spiral antenna may have the ultra-wideband characteristic, and it may generate circular polarization. According to various embodiments, the spiral antenna may be used for satellite communication or radar.

According to an embodiment, the yagiuda antenna may have high directivity. According to various embodiments, the yagiuda antenna may be installed outside as an antenna for a wireless set or a television receiver.

According to an embodiment, the Vivaldi antenna may have the wideband characteristic and high directivity. According to various embodiments, the Vivaldi antenna may be used as a reference antenna for measurement or an antenna for radar.

According to an embodiment, the holographic antenna may tilt beams using a flat-plate reflector as an antenna for creating a signal. According to various embodiments, the holographic antenna may be used for satellite communication or radar.

On the other hand, FIG. 3 illustrates an embodiment of the disclosure, and thus the scope of the disclosure should not be limited to the embodiment of FIG. 3. The flexible printed circuit board 301 may be bent or folded in various shapes, and the antenna module may perform the beamforming in various directions corresponding to the shape of the folded flexible printed circuit board.

Figure 4A:
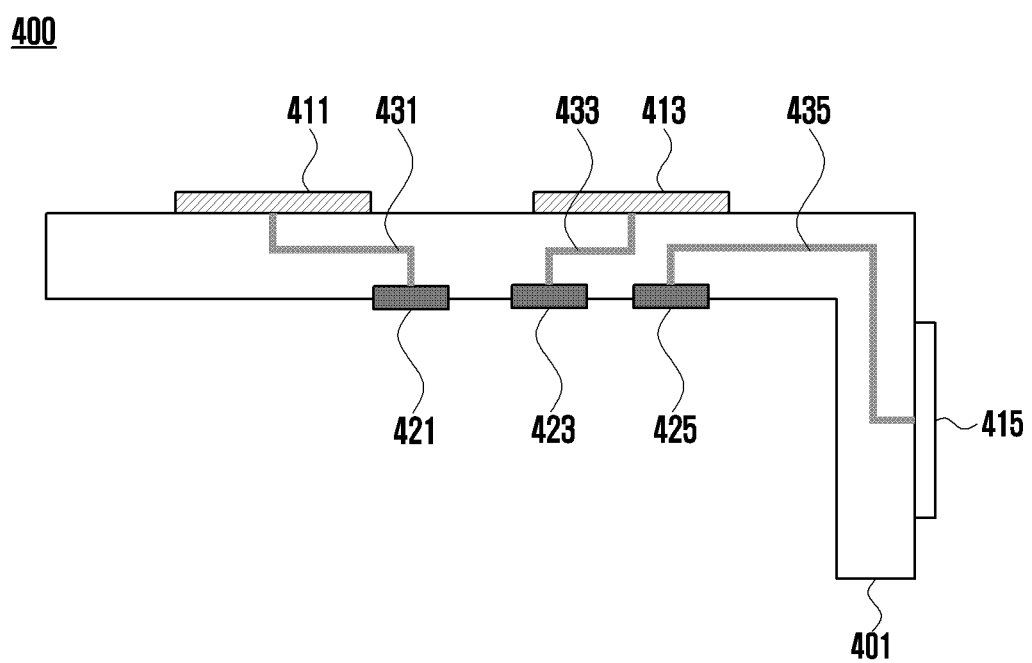
FIG. 4A is a diagram illustrating a side section of an antenna module in which antennas and feeding pads are deployed on a flexible printed circuit board according to an embodiment of the disclosure.

FIG. 4A is a diagram illustrating a side section of an antenna module in which antennas and feeding pads are deployed on a flexible printed circuit board according to an embodiment of the disclosure.

Referring to FIG. 4A, an antenna module 400 may include a flexible printed circuit board (FPCB) 401 including a first surface directed in a first direction and a second surface directed in a second direction that forms a predetermined first angle with respect to the first direction, a first antenna 411 deployed on one surface of the first surface and configured to form a first radiation region in a third direction, a second antenna 413 deployed on one surface of the first surface, deployed spaced apart from the first antenna 411, and configured to form a second radiation region in a third direction, a third antenna 415 deployed on one surface of the second surface and configured to form a third radiation region in a fourth direction, a first feeding pad 421 deployed on the other surface of the first surface, a second feeding pad 423 deployed on the other surface of the first surface, and a third feeding pad 425 deployed on the other surface of the first surface. According to various embodiments, the first feeding pad 421, the second feeding pad 423, and the third feeding pad 425 may be deployed on the other surface of the flexible printed circuit board 401 to be spaced apart from one another. According to an embodiment, the antenna module 400 may include a first feeding line 431 configured to electrically connect the first antenna 411 and the first feeding pad 421 to each other in the flexible printed circuit board 401. According to various embodiments, the first feeding line 431 may transfer a radio frequency (RF) signal being supplied through the first feeding pad 421 to the first antenna 411.

According to an embodiment, the antenna module 400 may include a second feeding line 433 configured to electrically connect the second antenna 413 and the second feeding pad 423 to each other in the flexible printed circuit board 401. According to various embodiments, the second feeding line 433 may transfer a radio frequency (RF) signal being supplied through the second feeding pad 423 to the second antenna 413.

According to an embodiment, the antenna module 400 may include a third feeding line 435 configured to electrically connect the third antenna 415 and the third feeding pad 425 to each other in the flexible printed circuit board 401. According to various embodiments, the third feeding line 435 may transfer a radio frequency (RF) signal being supplied through the third feeding pad 425 to the third antenna 415.

According to an embodiment, the antenna module 400 may be included inside an electronic device. According to various embodiments, in the case where the antenna module 400 is mounted inside the electronic device, the first direction may be a direction of a front plate or a rear plate of the electronic device, and the first antenna 411 and the second antenna 413 deployed on the first surface may perform beamforming in the direction of a front or rear surface of the electronic device.

According to an embodiment, in the case where the antenna module 400 is mounted inside the electronic device, the second direction may be a direction of a side surface of the electronic device, and the third antenna 415 deployed on the second surface may perform beamforming in the direction of the side surface of the electronic device. According to various embodiments, the first antenna 411 and the second antenna 413 may be broadside antennas of the electronic device, and the third antenna 415 may be an endfire antenna of the electronic device.

According to an embodiment, a region forming the first radiation region may be equal to a region forming the second radiation region. According to various embodiments, a partial region of a region that forms the first radiation region and the second radiation region may not overlap a partial region of a region that forms the third radiation region.

According to an embodiment, the antenna module 400 may include a controller (not illustrated) electrically connected to the first antenna 411, the second antenna 413, and the third antenna 415 and configured to control radiation directions of radio waves being radiated through the first antenna 411, the second antenna 413, and the third antenna 415. According to various embodiments, the controller may be deployed on a lower end surface of the flexible printed circuit board 401. For example, the controller may be included in a wireless communication chip deployed on the lower end surface of the flexible printed circuit board.

Figure 4B:
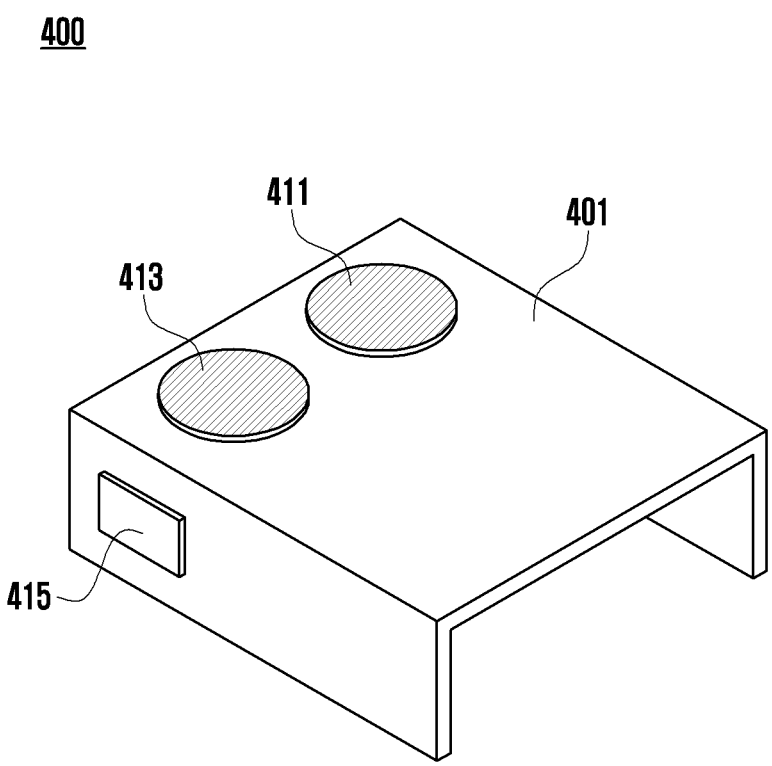
FIG. 4B is a diagram illustrating the structure of an antenna module in which antennas are deployed on a first surface and a second surface of a flexible printed circuit board according to an embodiment of the disclosure.

FIG. 4B is a diagram illustrating the structure of the antenna module 400 of FIG. 4A, in which antennas are deployed on a first surface and a second surface of a flexible printed circuit board according to an embodiment of the disclosure.

Referring to FIG. 4B, the antenna module 400 may include the first antenna 411 and the second antenna 413 deployed on an upper end surface of the flexible printed circuit board 401, and the third antenna 415 deployed on a side surface of the flexible printed circuit board 401. According to various embodiment, the antenna module 400 may be deployed in a closed space inside the electronic device. For example, the first antenna 411 and the second antenna 413 deployed on the upper end surface of the flexible printed circuit board 401 may radiate radio waves in directions of a front or rear surface of the electronic device, and the third antenna 415 deployed on the side surface of the flexible printed circuit board 401 may radiate radio waves to the side surface of the electronic device.

According to an embodiment, in the case where the antenna module 400 is deployed inside the electronic device, the first antenna 411 and the second antenna 413 may be broadside antennas of the electronic device, and the third antenna 415 may be an endfire antenna of the electronic device. According to various embodiment, by deploying the broadside antennas and the endfire antenna in one flexible printed circuit board 401 in all, a larger number of antennas can be deployed inside the electronic device, and the antennas can be deployed in various locations inside the electronic device.

On the other hand, FIGS. 4A and 4B illustrate an embodiment of the disclosure, and thus the scope of the disclosure should not be limited to the embodiment of FIGS. 4A and 4B. For example, the number of antennas deployed on the first surface of the flexible printed circuit board and the number of antennas deployed on the second surface of the flexible printed circuit board may be changed.

Figure 5A:
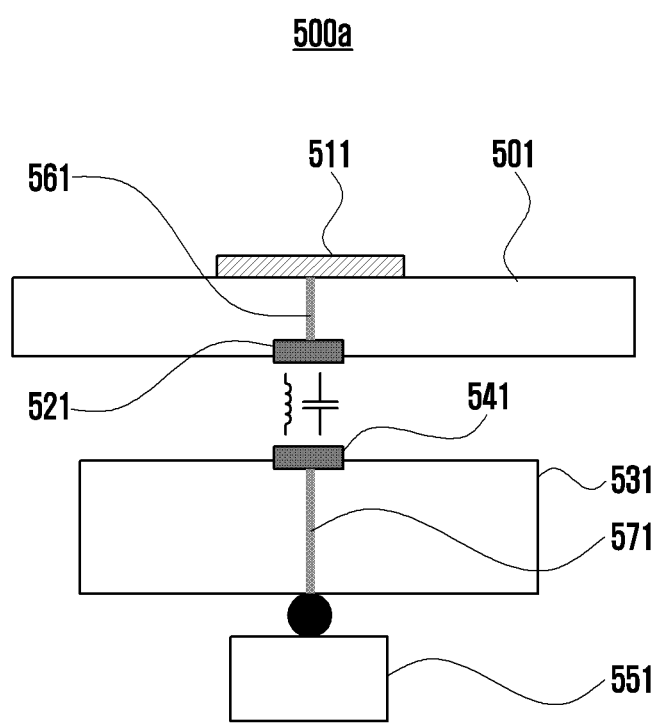
FIG. 5A is a diagram illustrating the structure of an antenna module including a flexible printed circuit board, a printed circuit board, and a wireless communication chip according to an embodiment of the disclosure.

FIG. 5A is a diagram illustrating the structure of an antenna module including a flexible printed circuit board, a printed circuit board, and a wireless communication chip according to an embodiment of the disclosure.

Referring to FIG. 5A, an antenna module 500a may include a flexible printed circuit board 501 directed in a first direction, a first antenna 511 deployed on one surface of the flexible printed circuit board 501, a first feeding pad 521 deployed on the other surface of the flexible printed circuit board 501, and a first feeding line 561 configured to electrically connect the first antenna 511 and the first feeding pad 521 to each other.

According to an embodiment, the antenna module 500a may include a printed circuit board 531 deployed spaced apart for a predetermined first length from the other surface of the flexible printed circuit board 501 and having at least one layer laminated therein, a second feeding pad 541 deployed on one surface of the printed circuit board 531 corresponding to the first feeding pad 521, a wireless communication chip 551 deployed on the other surface of the printed circuit board 531, and a second feeding line 571 configured to electrically connect the wireless communication chip 551 and the second feeding pad 541 to each other in the printed circuit board 531. According to various embodiments, the first length may be determined based on a wavelength of radio waves being radiated through the first antenna 511 or a coupling method. For example, it may be preferable to configure the first length to a value that is equal to or larger than 5 μm and is equal to or smaller than 500 μm.

According to an embodiment, because a space is formed between the flexible printed circuit board 501 and the printed circuit board 531, the flexible printed circuit board 501 and the printed circuit board 531 may be separated from each other. According to various embodiments, as a feeding method from the second feeding pad 541 to the first feeding pad 521, a capacitive coupling, inductive coupling, or resonant coupling method may be used.

According to an embodiment, the wireless communication chip 551 may transmit signals for radiating radio waves (e.g., basic signal, intermediate frequency signal, and local frequency signal) to the second feeding pad 541 through the second feeding line 571. According to various embodiments, the signal transmitted to the second feeding pad 541 may be transmitted to the first feeding pad 521 through a coupling pad method, and it may be transmitted to the first antenna 511 through the first feeding line 561.

According to an embodiment, in order for the first feeding pad 521 and the second feeding pad 541 to perform feeding through the coupling method, it is required that at least a part of the first feeding pad 521 and at least a part of the second feeding pad 541 face each other. According to various embodiments, in the coupling feeding method, it may be most preferable that the first feeding pad 521 and the second feeding pad 541 are deployed to face each other.

Figure 5B:
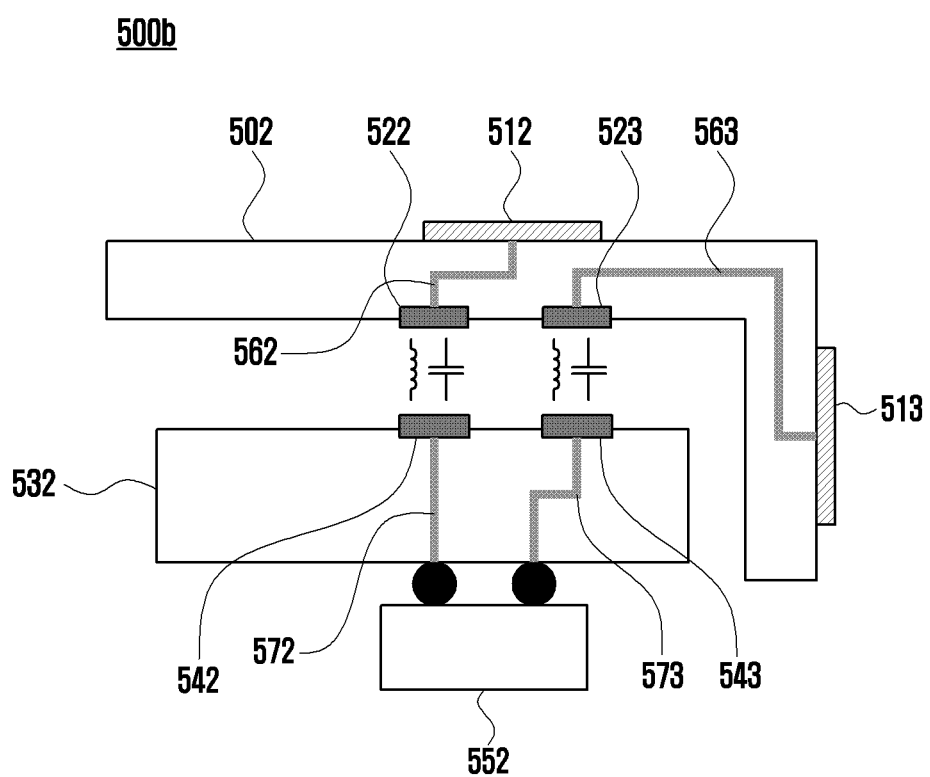
FIG. 5B is a diagram illustrating the structure of an antenna module including a flexible printed circuit board, a printed circuit board, and a wireless communication chip according to an embodiment of the disclosure.

FIG. 5B is a diagram illustrating the structure of an antenna module including a flexible printed circuit board, a printed circuit board, and a wireless communication chip according to an embodiment of the disclosure.

Referring to FIG. 5B, an antenna module 500b may include a flexible printed circuit board (FPCB) 502 including a first surface directed in a first direction and a second surface directed in a second direction that forms a predetermined first angle with respect to the first direction, a first antenna 512 deployed on one surface of the flexible printed circuit board 502 and configured to form a first radiation region in a third direction, a second antenna 513 deployed on one surface of the second surface and configured to form a second radiation region in a fourth direction, a first feeding pad 522 deployed on the other surface of the first surface, a second feeding pad 523 deployed on the other surface of the first surface, a first feeding line 562 configured to electrically connect the first antenna 512 and the first feeding pad 522 to each other, and a second feeding line 563 configured to electrically connect the second antenna 513 and the second feeding pad 523 to each other.

According to an embodiment, the antenna module 500b may include a printed circuit board 532 deployed spaced apart for a predetermined first length from the other surface of the first surface and having at least one layer laminated therein, a third feeding pad 542 deployed on one surface of the printed circuit board 532 corresponding to the first feeding pad 522, a fourth feeding pad 543 deployed on one surface of the printed circuit board 532 corresponding to the second feeding pad 523, a wireless communication chip 552 deployed on the other surface of the printed circuit board 532, a third feeding line 572 configured to electrically connect the wireless communication chip 552 and the third feeding pad 542 to each other in the printed circuit board 532, and a fourth feeding line 573 configured to electrically connect the wireless communication chip 552 and the fourth feeding pad 543 to each other in the printed circuit board 532. According to various embodiments, the first length may be determined based on a wavelength of radio waves being radiated through the first antenna 512 or the second antenna 513 and a coupling method. For example, it may be preferable to configure the first length to a value that is equal to or larger than 5 µm and is equal to or smaller than 500 µm.

According to an embodiment, because a space is formed between the flexible printed circuit board 502 and the printed circuit board 532, the flexible printed circuit board 502 and the printed circuit board 532 may be separated from each other. According to various embodiments, as a feeding method from the third feeding pad 542 to the first feeding pad 522 and a feeding method from the fourth feeding pad 543 to the second feeding pad 523, a capacitive coupling, inductive coupling, or resonant coupling method may be used.

According to an embodiment, the wireless communication chip 552 may transmit signals for radiating radio waves (e.g., basic signal, intermediate frequency signal, and local frequency signal) to the third feeding pad 542 and the fourth feeding pad 543 through the third feeding line 572 and the fourth feeding line 573. According to various embodiments, the signal transmitted to the third feeding pad 542 may be transmitted to the first feeding pad 522 through a coupling pad method, and it may be transmitted to the first antenna 512 through the first feeding line 562 (the signal transfer through the fourth feeding pad may also be the same as the signal transfer through the third feeding pad).

Figure 5C:
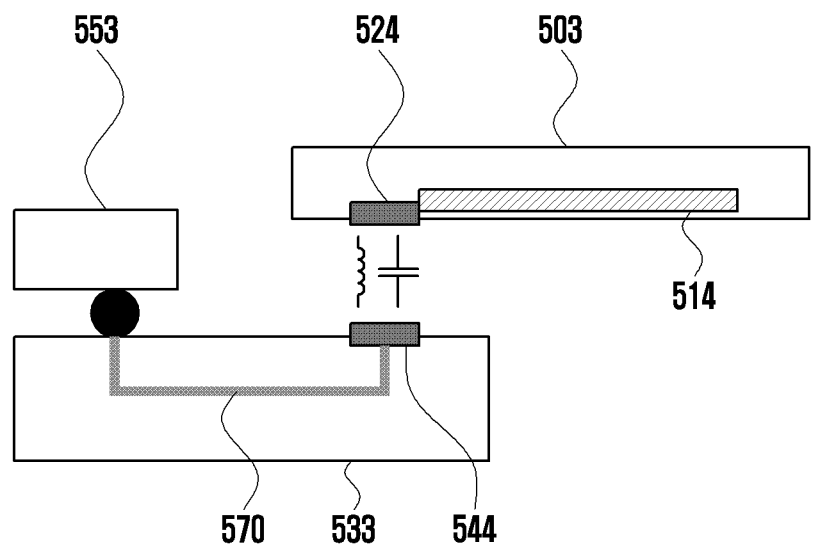
FIG. 5C is a diagram illustrating the structure of an antenna module including a flexible printed circuit board, a printed circuit board, and a wireless communication chip according to an embodiment of the disclosure.

FIG. 5C is a diagram illustrating the structure of an antenna module including a flexible printed circuit board, a printed circuit board, and a wireless communication chip according to an embodiment of the disclosure.

Referring to FIG. 5C, an antenna module 500c may include a flexible printed circuit board 503 directed in a first direction, a first antenna 514 deployed on one surface of the flexible printed circuit board 503, and a first feeding pad 524 deployed on the other surface of the flexible printed circuit board 503. According to various embodiments, the first antenna 514 and the first feeding pad 524 may be directly connected to each other.

According to an embodiment, the antenna module 500c may include a printed circuit board 533 deployed spaced apart for a predetermined first length from the other surface of the flexible printed circuit board 503 and having at least one layer laminated therein, a second feeding pad 544 deployed on one surface of the printed circuit board 533 corresponding to the first feeding pad 524, a wireless communication chip 553 deployed spaced apart from the second feeding pad 544 on one surface of the printed circuit board 533, and a first feeding line 570 configured to electrically connect the wireless communication chip 553 and the second feeding pad 544 to each other in the printed circuit board 533. According to various embodiments, the first length may be determined based on a wavelength of radio waves being radiated through the first antenna 514 or a coupling method. For example, it may be preferable to configure the first length to a value that is equal to or larger than 5 µm and is equal to or smaller than 500 µm.

According to an embodiment, because a space is formed between the flexible printed circuit board 503 and the printed circuit board 533, the flexible printed circuit board 503 and the printed circuit board 533 may be separated from each other. According to various embodiments, as a feeding method from the second feeding pad 544 to the first feeding pad 524, a capacitive coupling, inductive coupling, or resonant coupling method may be used.

According to an embodiment, the wireless communication chip 553 may transmit signals for radiating radio waves (e.g., basic signal, intermediate frequency signal, and local frequency signal) to the second feeding pad 544 through the first feeding line 570. According to various embodiments, the signal transmitted to the second feeding pad 544 may be transmitted to the first feeding pad 524 through a coupling pad method, and the signal transmitted to the first feeding pad 524 may be directly transmitted to the first antenna 514.

Figure 5D:
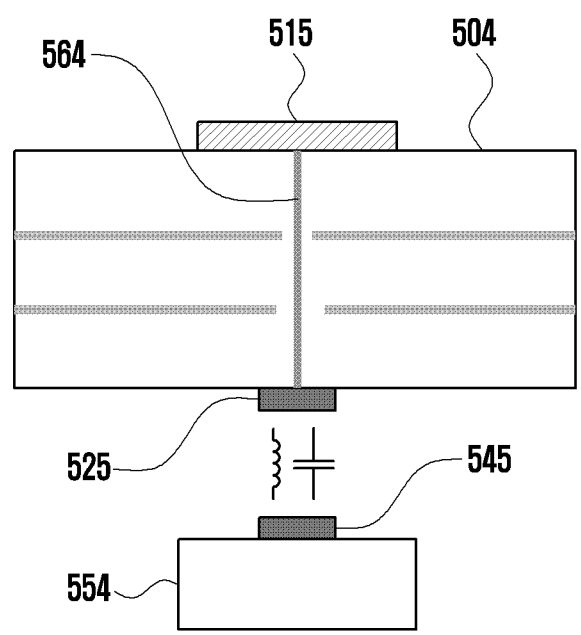
FIG. 5D is a diagram illustrating the structure of an antenna module including a flexible printed circuit board and a wireless communication chip according to an embodiment of the disclosure.

FIG. 5D is a diagram illustrating the structure of an antenna module including a flexible printed circuit board and a wireless communication chip according to an embodiment of the disclosure.

Referring to FIG. 5D, an antenna module 500d may include a flexible printed circuit board 504 directed in a first direction, a first antenna 515 deployed on one surface of the flexible printed circuit board 504, a first feeding pad 525 deployed on the other surface of the flexible printed circuit board 504, and a first feeding line 564 configured to electrically connect the first antenna 515 and the first feeding pad 525 to each other. According to various embodiments, the flexible printed circuit board may include a plurality of layers, and through the plurality of layers constituting the flexible printed circuit board 504, a distance between the first antenna 515 for radiating a radio frequency signal of a high frequency band and the wireless communication chip 554 can be secured.

According to an embodiment, the antenna module 500d may include the wireless communication chip 554 deployed spaced apart for the predetermined first length from the other surface of the flexible printed circuit board 504 and a second feeding pad 545 deployed on one surface of the wireless communication chip 554 corresponding to the first feeding pad 525. According to various embodiments, the first length may be determined based on a wavelength of radio waves being radiated through the first antenna 515 or a coupling method. For example, it may be preferable to configure the first length to a value that is equal to or larger than 5 µm and is equal to or smaller than 500 µm.

According to an embodiment, because a space is formed between the flexible printed circuit board 504 and the wireless communication chip 554, the flexible printed circuit board 504 and the wireless communication chip 554 may be separated from each other. According to various embodiments, as a feeding method from the second feeding pad 545 to the first feeding pad 525, a capacitive coupling, inductive coupling, or resonant coupling method may be used.

According to an embodiment, the wireless communication chip 554 may transmit signals for radiating radio waves (e.g., basic signal, intermediate frequency signal, and local frequency signal) to the second feeding pad 545. According to various embodiments, the signal transmitted to the second feeding pad 545 may be transmitted to the first feeding pad 525 through a coupling pad method, and it may be transmitted to the first antenna 515 through the first feeding line 564.

According to an embodiment, in order for the first feeding pad 525 and the second feeding pad 545 to perform feeding through the coupling method, it is required that at least a part of the first feeding pad 525 and at least a part of the second feeding pad 545 face each other. According to various embodiments, in the coupling feeding method, it may be most preferable that the first feeding pad 525 and the second feeding pad 545 are deployed to face each other.

On the other hand, because FIGS. 5A to 5D illustrate various embodiments of the disclosure, the scope of the disclosure should not be limited to the embodiments of FIGS. 5A to 5D. The antenna module structure may be changed within a range permitted by the ordinary technical level in accordance with designer's needs.

Figure 6A:
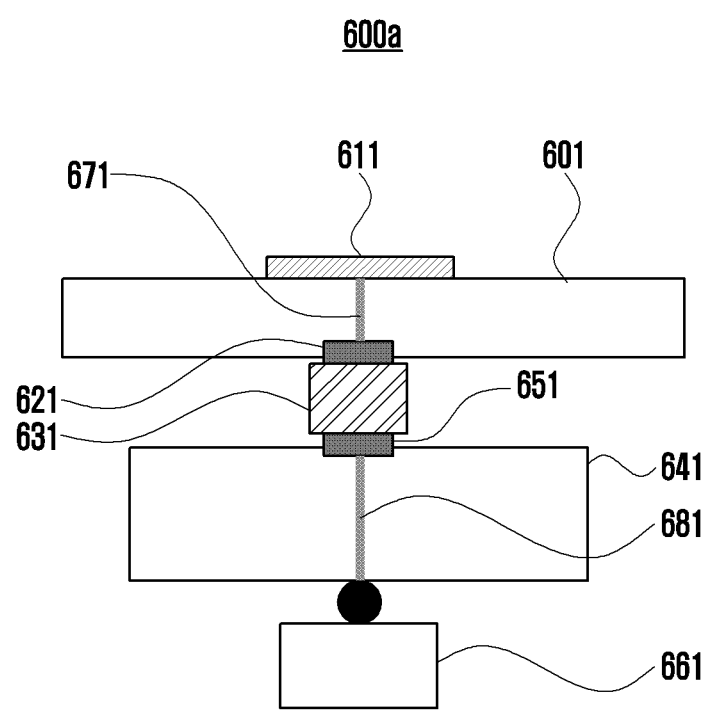
FIG. 6A is a diagram illustrating the structure of an antenna module including a flexible printed circuit board, a printed circuit board, a wireless communication chip, and a film layer according to an embodiment of the disclosure.

FIG. 6A is a diagram illustrating the structure of an antenna module including a flexible printed circuit board, a printed circuit board, a wireless communication chip, and a film layer according to an embodiment of the disclosure.

Referring to FIG. 6A, an antenna module 600*a* may include a flexible printed circuit board 601 directed in a first direction, a first antenna 611 deployed on one surface of the flexible printed circuit board 601, a first feeding pad 621 deployed on the other surface of the flexible printed circuit board 601, and a first feeding line 671 configured to electrically connect the first antenna 611 and the first feeding pad 621 to each other.

According to an embodiment, the antenna module 600*a* may include a film layer 631 configured to uniformly maintain a distance between the other surface of a first surface of the flexible printed circuit board 601 and one surface of a printed circuit board 641, the printed circuit board 641 in which at least one layer is laminated, a second feeding pad 651 deployed on one surface of the printed circuit board 641 corresponding to the first feeding pad 621, a wireless communication chip 661 deployed on the other surface of the printed circuit board 641, and a second feeding line 681 configured to electrically connect the wireless communication chip 661 and the second feeding pad 651 to each other in the printed circuit board 641. According to various embodiments, by the film layer 631, the flexible printed circuit board 601 may be uniformly spaced apart for a predetermined first length from the printed circuit board 641. For example, the first length may be determined based on a wavelength of radio waves being radiated through the first antenna 611 or a coupling method.

According to an embodiment, because a space is formed between the flexible printed circuit board 601 and the printed circuit board 641 by the film layer 631, the flexible printed circuit board 601 and the printed circuit board 641 may be separated from each other. According to various embodiments, as a feeding method from the second feeding pad 651 to the first feeding pad 621, a capacitive coupling, inductive coupling, or resonant coupling method may be used.

According to an embodiment, the film layer 631 may further include an adhesive layer configured to make the other surface of the first surface of the flexible printed circuit board 601 adhere to the one surface of the printed circuit board 641.

According to an embodiment, the adhesive layer may be composed of adhesives, and after the adhesives are deployed between the flexible printed circuit board 601 and the printed circuit board 641, an additional process, such as heating or photolithography, may be performed. According to various embodiments, the adhesive layer may be composed of a material capable of adhering even at ambient temperature. According to an embodiment, in order to increase the coupling effect between the first feeding pad 621 and the second feeding pad 651, the film layer 631 may be composed of a material having permittivity that is equal to or higher than a predetermined reference value.

According to an embodiment, the wireless communication chip 661 may transmit signals for radiating radio waves (e.g., basic signal, intermediate frequency signal, and local frequency signal) to the second feeding pad 651 through the second feeding line 681. According to various embodiments, the signal transmitted to the second feeding pad 651 may be transmitted to the first feeding pad 621 through a coupling pad method, and it may be transmitted to the first antenna 611 through the first feeding line 671.

According to an embodiment, in order for the first feeding pad 621 and the second feeding pad 651 to perform feeding through the coupling method, it is required that at least a part of the first feeding pad 621 and at least a part of the second feeding pad 651 face each other. According to various embodiments, in the coupling feeding method, it may be most preferable that the first feeding pad 621 and the second feeding pad 651 are deployed to face each other.

Figure 6B:
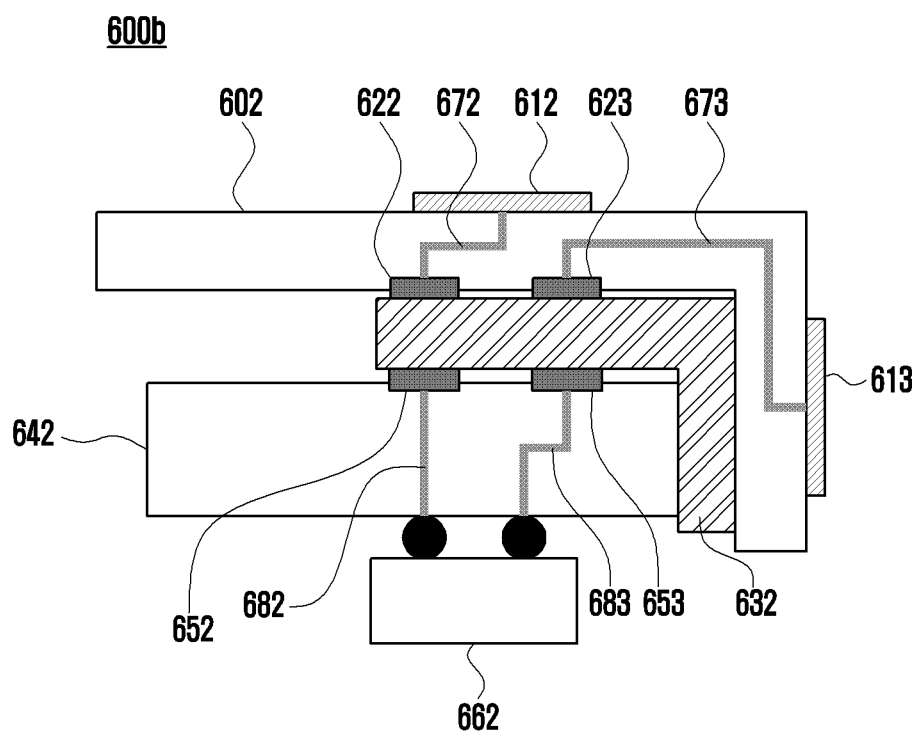
FIG. 6B is a diagram illustrating the structure of an antenna module including a flexible printed circuit board, a printed circuit board, a wireless communication chip, and a film layer according to an embodiment of the disclosure.

FIG. 6B is a diagram illustrating the structure of an antenna module including a flexible printed circuit board, a printed circuit board, a wireless communication chip, and a film layer according to an embodiment of the disclosure.

Referring to FIG. 6B, an antenna module 600*b* may include a flexible printed circuit board 602 including a first surface directed in a first direction and a second surface directed in a second direction that forms a predetermined first angle with respect to the first direction, a first antenna 612 deployed on one surface of the flexible printed circuit board 602, a second antenna 613 deployed on one surface of the second surface, a first feeding pad 622 deployed on the other surface of the first surface, a second feeding pad 623 deployed on the other surface of the first surface, a first feeding line 672 configured to electrically connect the first antenna 612 and the first feeding pad 622 to each other, and a second feeding line 673 configured to electrically connect the second antenna 613 and the second feeding pad 623 to each other.

According to an embodiment, the antenna module 600*b* may include a film layer 632 deployed between the other surface of the first surface of the flexible printed circuit board 602 and one surface of a printed circuit board 642 and configured to uniformly maintain a distance between the other surface of the first surface of the flexible printed circuit board 602 and the one surface of the printed circuit board 642, the printed circuit board 642 in which at least one layer is laminated, a third feeding pad 652 deployed on one surface of the printed circuit board 642 corresponding to the first feeding pad 622, a fourth feeding pad 653 deployed on one surface of the printed circuit board 642 corresponding to the second feeding pad 623, a wireless communication chip 662 deployed on the other surface of the printed circuit board 642, a third feeding line 682 configured to electrically connect the wireless communication chip 662 and the third feeding pad 652 to each other in the printed circuit board 642, and a fourth feeding line 683 configured to electrically connect the wireless communication chip 662 and the fourth feeding pad 653 to each other in the printed circuit board 642. According to various embodiments, by the film layer 632, the flexible printed circuit board 602 may be uniformly spaced apart for a predetermined first length from the printed circuit board 642. For example, the first length may be determined based on a wavelength of radio waves being radiated through the first antenna 612 or the second antenna 613 or a coupling method.

According to an embodiment, because a space is formed between the flexible printed circuit board 602 and the printed circuit board 642, the flexible printed circuit board 602 and the printed circuit board 642 may be separated from each other. According to various embodiments, as a feeding method from the third feeding pad 652 to the first feeding pad 622 and a feeding method from the fourth feeding pad 653 to the second feeding pad 623, a capacitive coupling, inductive coupling, or resonant coupling method may be used.

According to an embodiment, the wireless communication chip 662 may transmit signals for radiating radio waves (e.g., basic signal, intermediate frequency signal, and local frequency signal) to the third feeding pad 652 and the fourth feeding pad 653 through the third feeding line 682 and the fourth feeding line 683. According to various embodiments, the signal transmitted to the third feeding pad 652 may be transmitted to the first feeding pad 622 through a coupling pad method, and it may be transmitted to the first antenna 612 through the first feeding line 672 (the signal transfer through the fourth feeding pad may also be the same as the signal transfer through the third feeding pad).

Figure 6C:
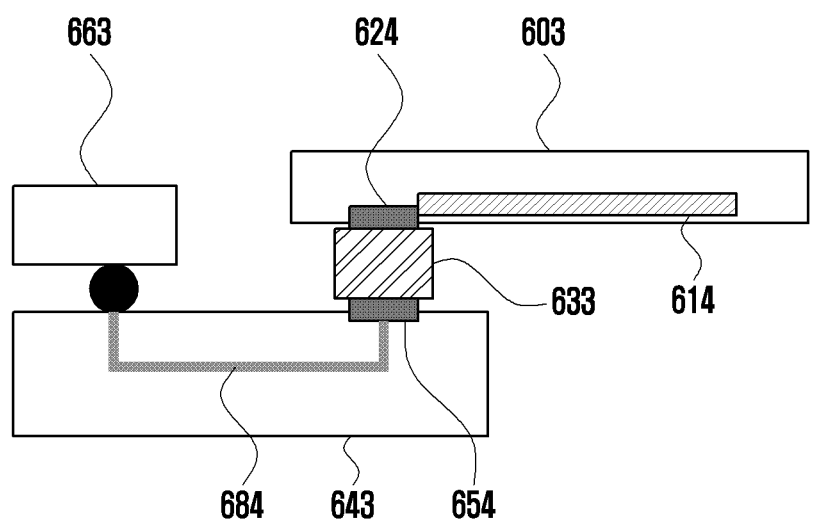
FIG. 6C is a diagram illustrating the structure of an antenna module including a flexible printed circuit board, a printed circuit board, a wireless communication chip, and a film layer according to an embodiment of the disclosure.

FIG. 6C is a diagram illustrating the structure of an antenna module including a flexible printed circuit board, a printed circuit board, a wireless communication chip, and a film layer according to an embodiment of the disclosure.

Referring to FIG. 6C, an antenna module 600c may include a flexible printed circuit board 603 directed in a first direction, a first antenna 614 deployed on one surface of the flexible printed circuit board 603, and a first feeding pad 624 deployed on one surface of the flexible printed circuit board 603. According to various embodiments, the first antenna 614 and the first feeding pad 624 may be directly connected to each other.

According to an embodiment, the antenna module 600c may include a film layer 633 deployed between the other surface of a first surface of the flexible printed circuit board 603 and one surface of a printed circuit board 643 and configured to uniformly maintain a distance between the other surface of the first surface of the flexible printed circuit board 603 and the one surface of the printed circuit board 643, the printed circuit board 643 in which at least one layer is laminated, a second feeding pad 654 deployed on one surface of the printed circuit board 643 corresponding to the first feeding pad 624, a wireless communication chip 663 deployed spaced apart from the second feeding pad 654 on one surface of the printed circuit board 643, and a first feeding line 684 configured to electrically connect the wireless communication chip 663 and the second feeding pad 654 to each other in the printed circuit board 643. According to various embodiments, by the film layer 633, the flexible printed circuit board 603 may be uniformly spaced apart for a predetermined first length from the printed circuit board 643. For example, the first length may be determined based on a wavelength of radio waves being radiated through the first antenna 614 or a coupling method.

According to an embodiment, because a space is formed between the flexible printed circuit board 603 and the printed circuit board 643, the flexible printed circuit board 603 and the printed circuit board 643 may be separated from each other. According to various embodiments, as a feeding method from the second feeding pad 654 to the first feeding pad 624, a capacitive coupling, inductive coupling, or resonant coupling method may be used.

According to an embodiment, the wireless communication chip 663 may transmit signals for radiating radio waves (e.g., basic signal, intermediate frequency signal, and local frequency signal) to the second feeding pad 654 through the first feeding line 684. According to various embodiments, the signal transmitted to the second feeding pad 654 may be transmitted to the first feeding pad 624 through a coupling pad method, and the signal transmitted to the first feeding pad 624 may be directly transmitted to the first antenna 614.

Figure 6D:
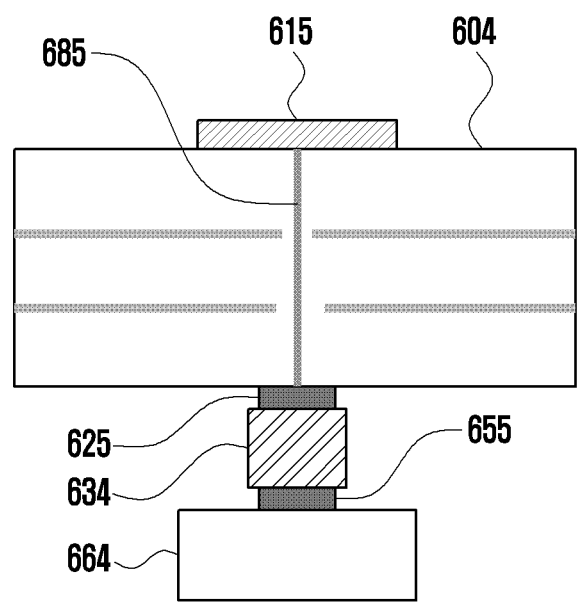
FIG. 6D is a diagram illustrating the structure of an antenna module including a flexible printed circuit board, a wireless communication chip, and a film layer according to an embodiment of the disclosure.

FIG. 6D is a diagram illustrating the structure of an antenna module including a flexible printed circuit board, a wireless communication chip, and a film layer according to an embodiment of the disclosure.

Referring to FIG. 6D, an antenna module 600d may include a flexible printed circuit board 604 directed in a first direction, a first antenna 615 deployed on one surface of the flexible printed circuit board 604, a first feeding pad 625 deployed on the other surface of the flexible printed circuit board 604, and a first feeding line 685 configured to electrically connect the first antenna 615 and the first feeding pad 625 to each other. According to various embodiments, the flexible printed circuit board 604 may include a plurality of layers, and through the plurality of layers constituting the flexible printed circuit board, a distance between the first antenna 615 for radiating a radio frequency signal of a high frequency band and the wireless communication chip 664 can be secured.

According to an embodiment, the antenna module 600d may include a film layer 631 configured to uniformly maintain a distance between the other surface of a first surface of the flexible printed circuit board 601 and one surface of the wireless communication chip 661, the wireless communication chip 661 having one surface facing the other surface of the film layer 634, and a second feeding pad 655 deployed on one surface of the wireless communication chip 664 corresponding to the first feeding pad 625. According to various embodiments, by the film layer 634, the flexible printed circuit board 604 may be uniformly spaced apart for a predetermined first length from the wireless communication chip 664. For example, the first length may be determined based on a wavelength of radio waves being radiated through the first antenna 615 or a coupling method.

According to an embodiment, because a space is formed between the flexible printed circuit board 604 and the wireless communication chip 664, the flexible printed circuit board 604 and the wireless communication chip 664 may be separated from each other. According to various embodiments, as a feeding method from the second feeding pad 655 to the first feeding pad 625, a capacitive coupling, inductive coupling, or resonant coupling method may be used.

According to an embodiment, the wireless communication chip 664 may transmit signals for radiating radio waves (e.g., basic signal, intermediate frequency signal, and local frequency signal) to the second feeding pad 655. According to various embodiments, the signal transmitted to the second feeding pad 655 may be transmitted to the first feeding pad 625 through a coupling pad method, and it may be transmitted to the first antenna 615 through the first feeding line 685.

According to an embodiment, in order for the first feeding pad 625 and the second feeding pad 655 to perform feeding through the coupling method, it is required that at least a part of the first feeding pad 625 and at least a part of the second feeding pad 655 face each other. According to various embodiments, in the coupling feeding method, it may be most preferable that the first feeding pad 625 and the second feeding pad 655 are deployed to face each other.

On the other hand, because FIGS. 6A to 6D illustrate embodiments of the disclosure, the scope of the disclosure should not be limited to the embodiments of FIGS. 6A to 6D. The antenna module structure may be changed within a range permitted by the ordinary technical level in accordance with designer's needs.

Figure 7A:
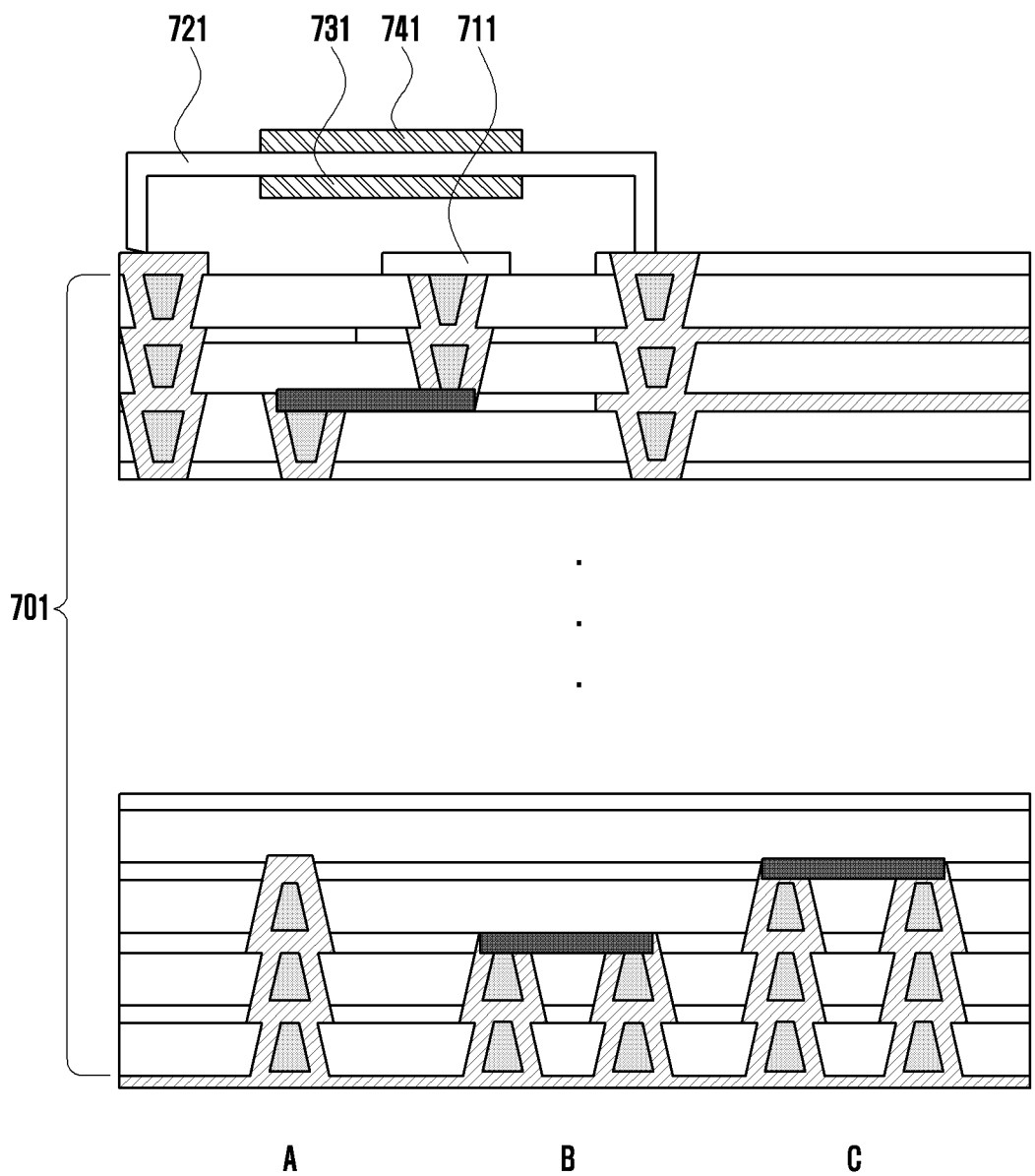
FIG. 7A is a diagram illustrating a side section of an antenna module including a flexible printed circuit board, a printed circuit board, a first antenna, and a second antenna according to an embodiment of the disclosure.

FIG. 7A is a diagram illustrating a side section of an antenna module including a flexible printed circuit board, a printed circuit board, a first antenna, and a second antenna according to an embodiment of the disclosure.

Referring to FIG. 7A, an antenna module may include a printed circuit board 701 in which a plurality of layers are laminated. For example, the printed circuit board 701 may be formed through lamination of 18 layers. According to various embodiments, a via hole may be formed on each layer of the printed circuit board 701. For example, the printed circuit board 701 may include via holes by a laser process and via holes by a plated through-hole (PTH) process.

According to an embodiment, a feeding part 711, to which an electrical signal for radiating radio waves is supplied, may be deployed on one surface of the printed circuit board 701. For example, the feeding part 711 may be deployed on the first layer that is laminated on an upper end surface of the printed circuit board 701. According to various embodiments, a via hole may be formed on the first layer by the laser process, and through the via hole, the feeding part 711 may be provided with the electrical signal for radiating the radio waves.

According to an embodiment, through the laser process, via holes may be formed even on the second layer and the third layer deployed below (in the lamination direction) the first layer deployed on the upper end surface of the printed circuit board 701. According to various embodiments, a ground may be deployed on one surface of the third layer.

According to an embodiment, an electrical signal for creating a radio frequency may be supplied to the other surface of the printed circuit board 701. For example, in order to generate the radio frequency, a basic signal for creating the radio frequency, an intermediate frequency signal and a local frequency signal for changing the frequency of the basic signal may be necessary, and the basic signal, the intermediate frequency signal, and the local frequency signal may be supplied to the other surface of the printed circuit board 701.

According to an embodiment, the basic signal may be supplied through "A" deployed on the other surface of the printed circuit board 701. According to various embodiments, the basic signal being supplied through "A" may be transmitted to the feeding part 711 deployed on one surface of the printed circuit board 701 through the via holes formed on the printed circuit board 701.

According to an embodiment, the intermediate frequency signal may be supplied through "B" deployed on the other surface of the printed circuit board 701. According to various embodiments, the intermediate frequency signal being supplied through "B" may be transmitted to the printed circuit board 701 through the via holes formed on the printed circuit board 701.

According to an embodiment, the local frequency signal may be supplied through "C" deployed on the other surface of the printed circuit board 701. According to various embodiments, the local frequency signal being supplied through "C" may be transmitted to the printed circuit board 701 through the via holes formed on the printed circuit board 701.

According to an embodiment, a flexible printed circuit board 721 on which antennas are deployed may be combined with one surface of the printed circuit board 701. According to various embodiments, on one surface of the flexible printed circuit board 721 facing the feeding part 711, a first antenna 731 for receiving the electrical signal from the feeding part 711 and radiating radio waves may be deployed. That is, according to the antenna module structure disclosed in the disclosure, the first antenna 731 and the feeding part 711 may have a coupling structure in which they are not directly connected to each other.

According to an embodiment, because the feeding part 711 and the first antenna 731 are not directly connected to each other, antennas can be freely deployed in the antenna module. That is, according to the antenna module structure disclosed in the disclosure, the degree of freedom of the antenna module design can be improved.

According to an embodiment, a second antenna 741 may be deployed on the other surface of the flexible printed circuit board 721. According to various embodiments, the performance of the antenna module may be determined based on a separation distance between the first antenna 731 and the second antenna 741.

Figure 7B:
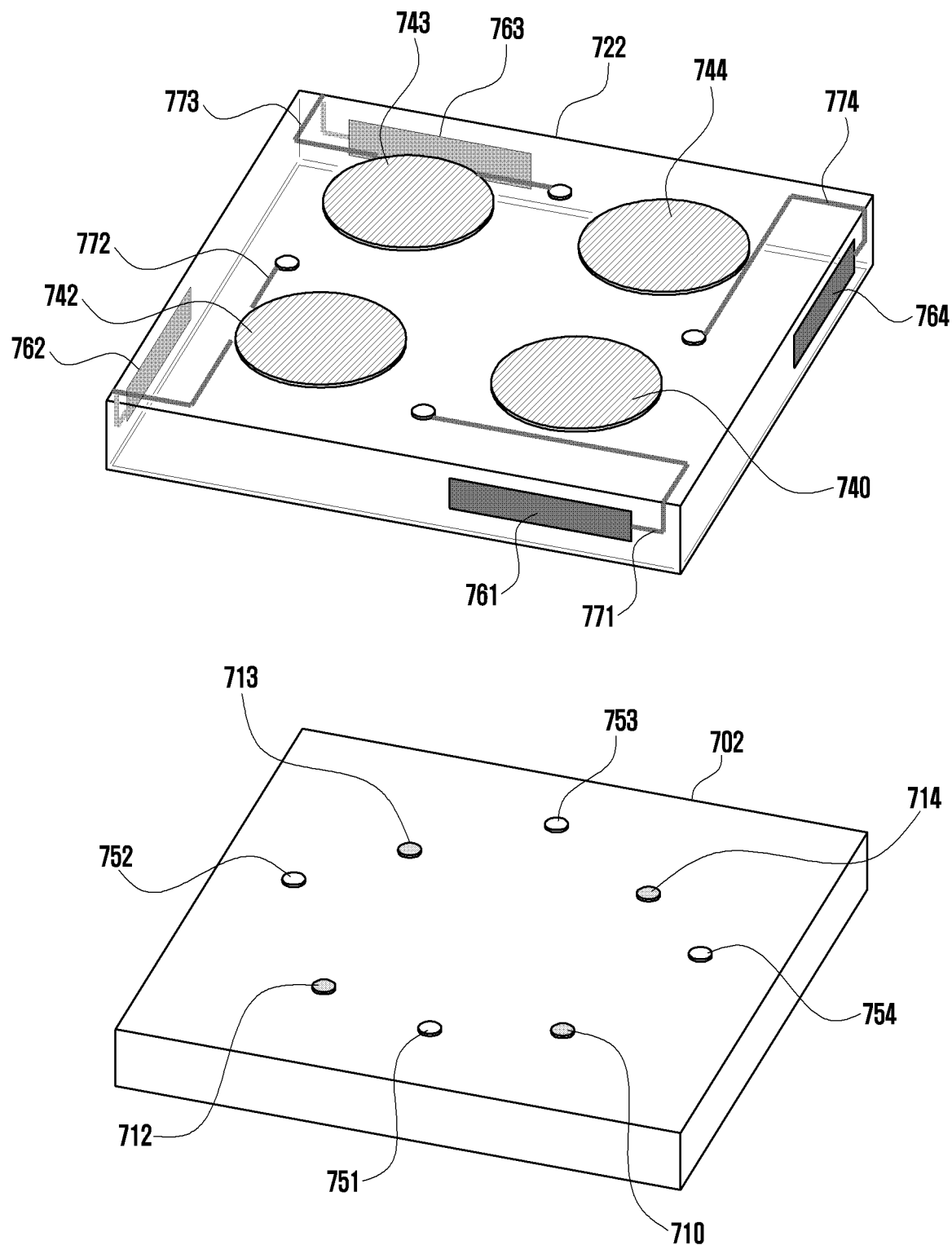
FIG. 7B is a diagram illustrating the structure of an antenna module including a plurality of antennas according to an embodiment of the disclosure.

FIG. 7B is a diagram illustrating the structure of an antenna module including a plurality of antennas according to an embodiment of the disclosure.

Referring to FIG. 7B, an antenna module may include a first antenna 740, a second antenna 742, a third antenna 743, and a fourth antenna 744 that are deployed on an upper end surface of the flexible printed circuit board 722 and a fifth antenna 761, a sixth antenna 762, a seventh antenna 763, and an eighth antenna 764 that are deployed on a side surface of the flexible printed circuit board 722. According to various embodiments, the antenna module may be deployed in a closed space on the inside of an electronic device. For example, the first antenna 740, the second antenna 742, the third antenna 743, and the fourth antenna 744 deployed on the upper end surface of the flexible printed circuit board 722 may radiate radio waves in a direction of a front or rear surface of the electronic device, and the fifth antenna 761, the sixth antenna 762, the seventh antenna 763, and the eighth antenna 764 deployed on the side surface of the flexible printed circuit board 722 may radiate radio waves toward the side surface of the electronic device.

According to an embodiment, if the antenna module is deployed inside the electronic device, the first antenna 740, the second antenna 742, the third antenna 743, and the fourth antenna 744 may be broadside antennas of the electronic device, and the fifth antenna 761, the sixth antenna 762, the seventh antenna 763, and the eighth antenna 764 may be endfire antennas of the electronic device. According to various embodiments, by deploying the broadside antennas and the endfire antennas on one flexible printed circuit board 722 in all, a larger number of antennas can be deployed inside the electronic device, and the antennas can be deployed in various locations inside the electronic device.

According to an embodiment, on a lower end surface of the flexible printed circuit board 722, a printed circuit board 702, on which a plurality of layers are laminated, may be deployed. According to various embodiments, the lower end surface of the flexible printed circuit board 722 and an upper end surface of the printed circuit board 702 may be spaced apart for a first length from each other. For example, the first length may be determined based on the wavelength of the radio waves to be radiated through the antenna module.

According to an embodiment, on the upper end surface of the printed circuit board 702, a first feeding pad 710 for feeding to the first antenna 740, a second feeding pad 712 for feeding to the second antenna 742, a third feeding pad 713 for feeding to the third antenna 743, and a fourth feeding pad 714 for feeding to the fourth antenna 744 may be deployed. According to various embodiments, each feeding pad may be spaced apart for the first length from each broadside antenna. That is, with respect to the first antenna 740, the second antenna 742, the third antenna 743, and the fourth antenna 744, feeding may be performed through a coupling method.

According to an embodiment, on the side surface of the printed circuit board 702, a fifth feeding pad 751 for feeding to the fifth antenna 761, a sixth feeding pad 752 for feeding to the sixth antenna 762, a seventh feeding pad 753 for feeding to the seventh antenna 763, and an eighth feeding pad 754 for feeding to the eighth antenna 764 may be deployed. According to various embodiments, each feeding pad may be spaced apart for the first length from each endfire antenna. That is, with respect to the fifth antenna 761, the sixth antenna 762, the seventh antenna 763, and the eighth antenna 764, feeding may be performed through a coupling method.

According to an embodiment, an electrical signal being supplied through the fifth feeding pad 751 deployed on the upper end surface of the printed circuit board 702 may be transmitted to the fifth antenna 761 deployed on the side surface of the printed circuit board 702 through a first feeding line 771. In the same manner, an electrical signal being supplied through the sixth feeding pad 752 may be transmitted to the sixth antenna 762 through a second feeding line 772, and an electrical signal being supplied through the seventh feeding pad 753 may be transmitted to the seventh antenna 763 through a third feeding line 773, and an electrical signal being supplied through the eighth feeding pad 754 may be transmitted to the eighth antenna 764 through a fourth feeding line 774.

On the other hand, because FIGS. 7A and 7B illustrate embodiments of the disclosure, the scope of the disclosure should not be limited to the embodiments of FIGS. 7A and 7B. The number of endfire antennas deployed on the side surface of the flexible printed circuit board may be changed in accordance with designer's needs.

Figure 7C:
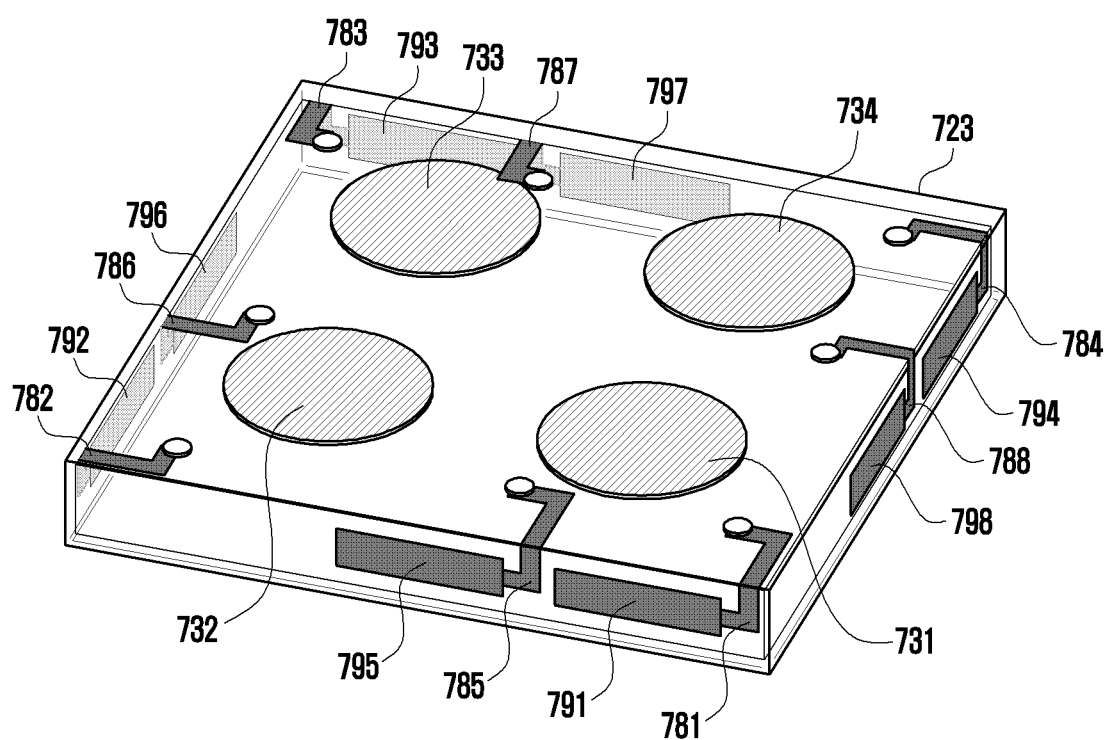
FIG. 7C is a diagram illustrating the structure of an antenna module including a plurality of antennas according to an embodiment of the disclosure.

FIG. 7C is a diagram illustrating the structure of an antenna module including a plurality of antennas according to an embodiment of the disclosure.

Referring to FIG. 7C, an antenna module may include a first antenna 731, a second antenna 732, a third antenna 733, and a fourth antenna 734 that are deployed on an upper end surface of the flexible printed circuit board 723 and a fifth antenna 791, a sixth antenna 792, a seventh antenna 793, an eighth antenna 794, a ninth antenna 795, a tenth antenna 796, an eleventh antenna 797, and a twelfth antenna 798 that are deployed on a side surface of the flexible printed circuit board 723. According to various embodiments, the antenna module may be deployed in a closed space on the inside of an electronic device. For example, the first antenna 731, the second antenna 732, the third antenna 733, and the fourth antenna 734 deployed on the upper end surface of the flexible printed circuit board 723 may radiate radio waves in a direction of a front or rear surface of the electronic device, and the fifth antenna 791, the sixth antenna 792, the seventh antenna 793, the eighth antenna 794, the ninth antenna 795, the tenth antenna 796, the eleventh antenna 797, and the twelfth antenna 798 deployed on the side surface of the flexible printed circuit board 723 may radiate radio waves toward the side surface of the electronic device.

According to an embodiment, if the antenna module is deployed inside the electronic device, the first antenna 731, the second antenna 732, the third antenna 733, and the fourth antenna 734 may be broadside antennas of the electronic device, and the fifth antenna 791, the sixth antenna 792, the seventh antenna 793, the eighth antenna 794, the ninth antenna 795, the tenth antenna 796, the eleventh antenna 797, and the twelfth antenna 798 may be endfire antennas of the electronic device. According to various embodiments, by deploying the broadside antennas and the endfire antennas on one flexible printed circuit board 723 in all, a larger number of antennas can be deployed inside the electronic device, and the antennas can be deployed in various locations inside the electronic device.

According to an embodiment, on a lower end surface of the flexible printed circuit board 723, a printed circuit board (not shown), on which a plurality of layers are laminated, may be deployed. According to various embodiments, the lower end surface of the flexible printed circuit board 723 and an upper end surface of the printed circuit board may be spaced apart for a first length from each other. For example, the first length may be determined based on the wavelength of the radio waves to be radiated through the antenna module.

According to an embodiment, electrical signals being supplied through the plurality of feeding pads deployed on the upper end surface of the printed circuit board may be transmitted to the fifth antenna 791 deployed on the side surface of the printed circuit board through the first feeding line 781. In the same manner, the sixth antenna 792 to the twelfth antenna 798 may be supplied with electrical signals for radiating the radio waves through the second feeding line 782 to the eighth feeding line 788 corresponding to the respective antennas.

Figure 8:
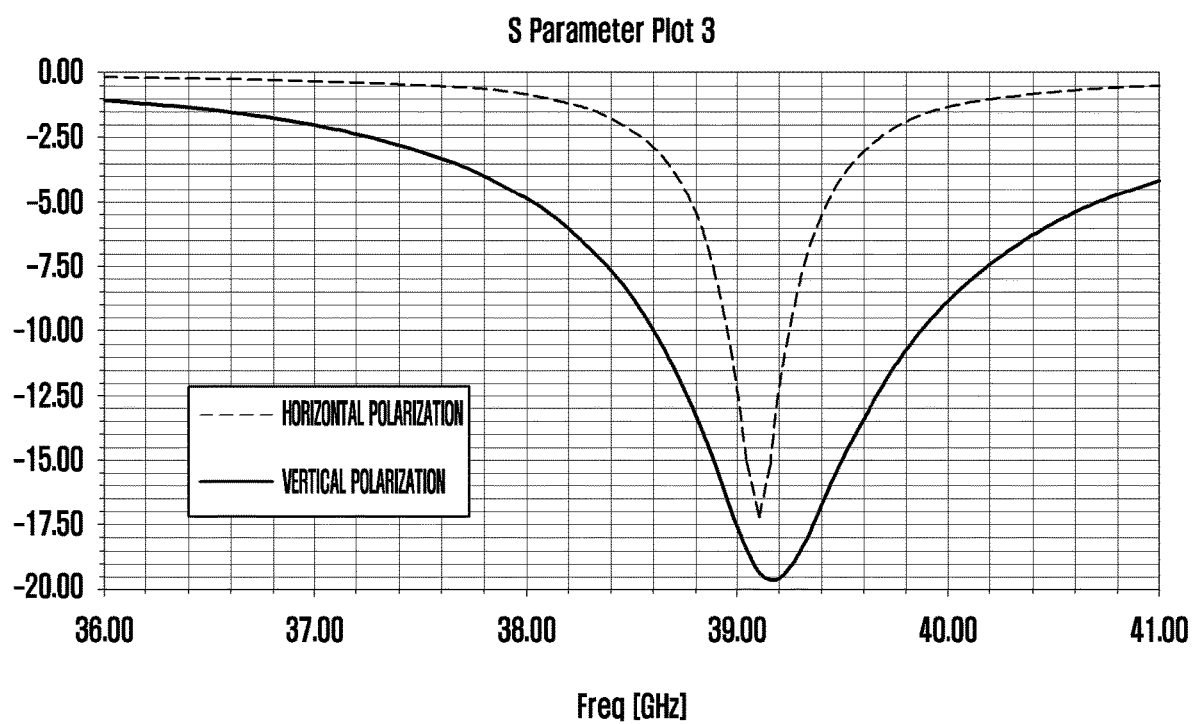
FIG. 8 is a graph of s parameters of an antenna module according to an embodiment of the disclosure.

FIG. 8 is a graph of s parameters of an antenna module according to an embodiment of the disclosure.

FIG. 8 shows a graph of s parameters in the case of using an antenna module structure according to the disclosure on the assumption that the frequency band to be radiated is 39 GHz.

Referring to FIG. 8, according to the antenna module structure according to the disclosure, it can be identified that both vertical polarization and horizontal polarization have high gain values (in case of horizontal polarization, about 15 dB, and in case of vertical polarization, about 20 dB) in 39 GHz frequency band. That is, through the graph of FIG. 8, it can be identified that the antenna module structure disclosed in the disclosure can be applied to high frequency bands.

Figure 9A:
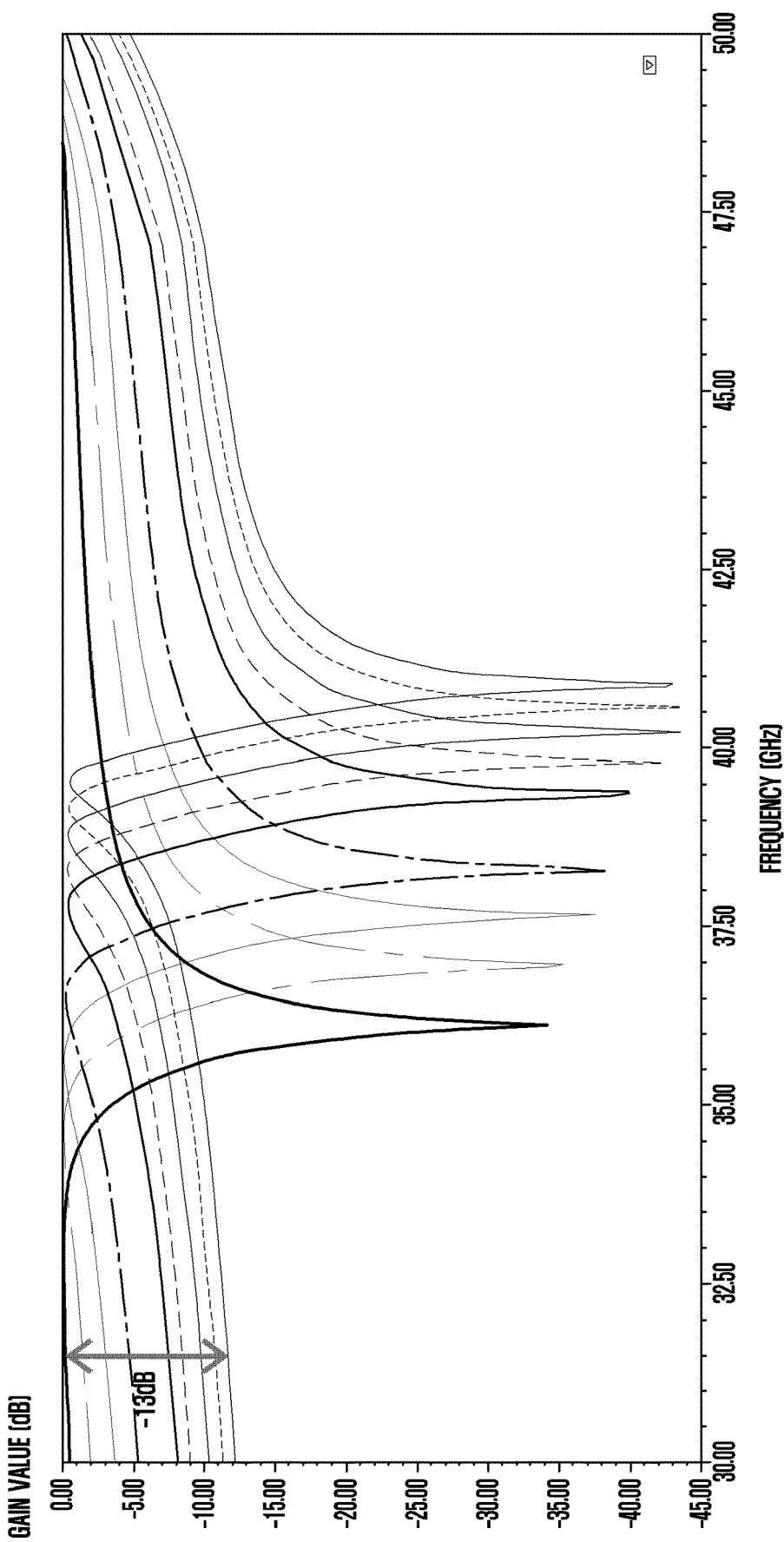
FIG. 9A is a graph illustrating the deterioration degree of a gain value in accordance with a distance between coupling pads in an antenna module structure according to an embodiment of the disclosure.

FIG. 9A is a graph illustrating the deterioration degree of a gain value in accordance with a distance between coupling pads in an antenna module structure according to an embodiment of the disclosure.

Referring to FIG. 9A, a plurality of antenna arrays may be deployed on one flexible printed circuit board constituting an antenna module. For example, in the 5G mobile communication system using 6 GHz or more frequency band, 256 antenna arrays may be deployed on one flexible printed circuit board. According to various embodiments, in the case where a plurality of antenna arrays are deployed on one flexible printed circuit board, feeding pads may be formed on one surface of the flexible printed circuit board corresponding to the respective antenna arrays and one surface of the printed circuit board facing one surface of the flexible printed circuit board.

According to an embodiment, a feeding pad formed on the flexible printed circuit board and a feeding pad formed on the printed circuit board may be spaced apart for a predetermined distance from each other. According to various embodiments, distances between the plurality of feeding pads formed on the flexible printed circuit board and the plurality of feeding pads formed on the printed circuit board may not uniform. For example, due to flexibility of the flexible printed circuit board, the distances between the plurality of feeding pads formed on the flexible printed circuit board and the plurality of feeding pads formed on the printed circuit board may have errors of about 100 μm.

FIG. 9A is a graph illustrating s parameters in accordance with distance errors between the plurality of feeding pads formed on the flexible printed circuit board and the plurality of feeding pads formed on the printed circuit board. More specifically, FIG. 9A is a graph illustrating the deterioration degree of the gain value in accordance with the frequency in the case where the distance errors between the plurality of feeding pads formed on the flexible printed circuit board and the plurality of feeding pads formed on the printed circuit board are formed in the range of 0 to 100 µm at an interval of 10 µm.

According to the graph of FIG. 9A, in the case where the distance errors between the plurality of feeding pads formed on the flexible printed circuit board and the plurality of feeding pads formed on the printed circuit board are 100 µm, it can be identified that the gain value deterioration of about 13 dB occurs in comparison with a case of no distance error.

Figure 9B:
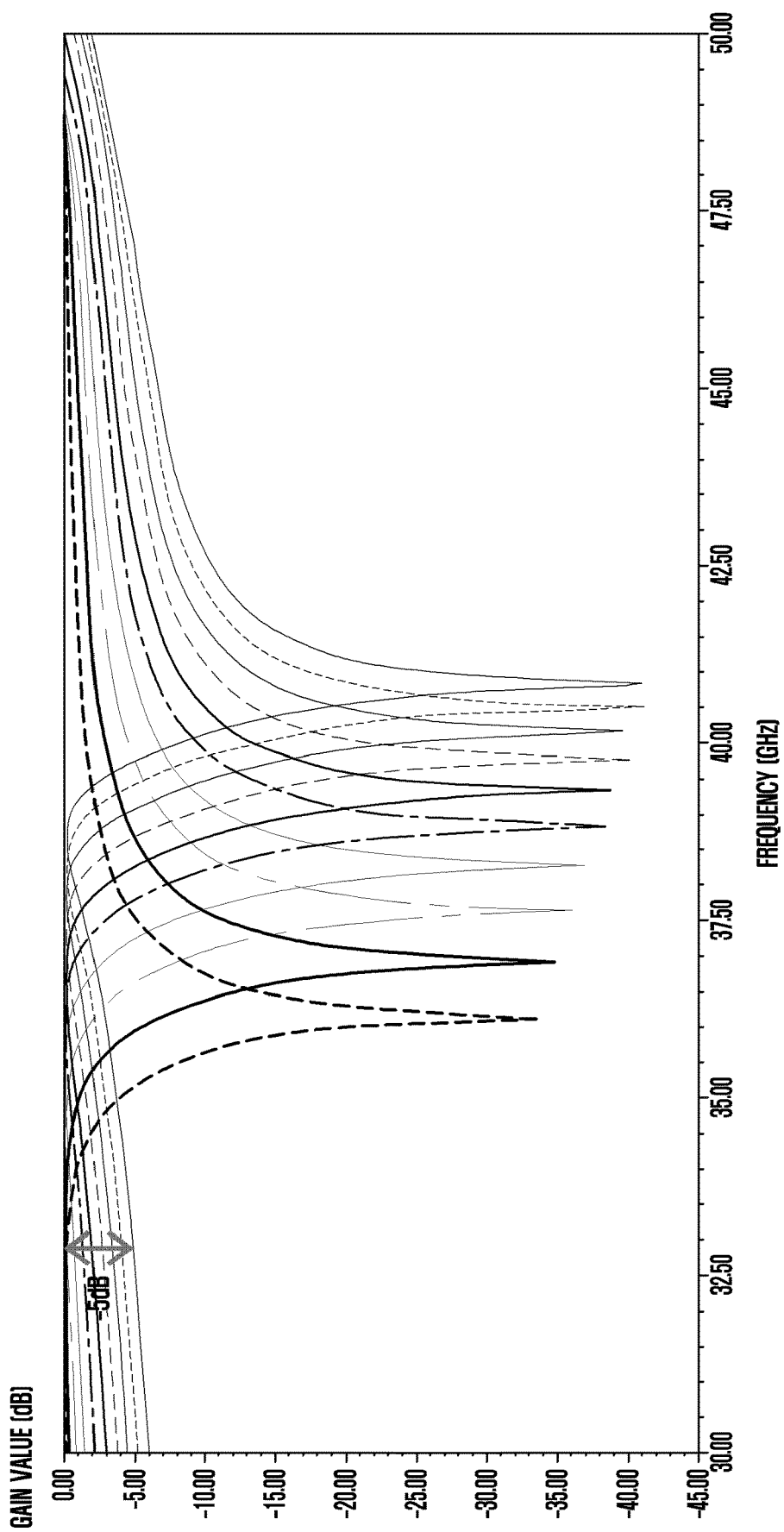
FIG. 9B is a graph illustrating the deterioration degree of a gain value in accordance with a distance between coupling pads in an antenna module structure including an adhesive layer according to an embodiment of the disclosure.

FIG. 9B is a graph illustrating the deterioration degree of a gain value in accordance with a distance between coupling pads in an antenna module structure including an adhesive layer according to an embodiment of the disclosure.

The graph illustrated in FIG. 9B is a graph illustrating s parameters in accordance with distance errors between the plurality of feeding pads and the plurality of feeding pads formed on the printed circuit board in the case where a film layer including an adhesive layer (e.g., double-sided tape) between the plurality of feeding pads formed on the flexible printed circuit board and the plurality of feeding pads formed on the printed circuit board. More specifically, in the same manner as the graph of FIG. 9A, the graph of FIG. 9B is a graph illustrating the deterioration degree of the gain value in accordance with the frequency in the case where the distance errors between the plurality of feeding pads formed on the flexible printed circuit board and the plurality of feeding pads formed on the printed circuit board are formed in the range of 0 to 100 µm at an interval of 10 µm.

According to an embodiment, permittivity of the film layer applied in a simulation illustrated in the graph of FIG. 9B may be about 2.7. According to the graph of FIG. 9B, in the case where the distance errors between the plurality of feeding pads formed on the flexible printed circuit board and the plurality of feeding pads formed on the printed circuit board in a specific frequency (e.g., 32.5 GHz) are 100 µm, it can be identified that the gain value deterioration of about 5 dB occurs in comparison with a case of no distance error.

That is, by deploying the film layer having a specific permittivity between the flexible printed circuit board and the printed circuit board through comparison of the graph illustrated in FIG. 9A and the graph illustrated in FIG. 9B, it can be identified that the gain value deterioration of the antenna module is reduced. In addition, in the case of combining one surface of the flexible printed circuit board with one surface of the printed circuit board through a double-sided tape, the distances between the plurality of feeding pads formed on the flexible printed circuit board and the plurality of feeding pads formed on the printed circuit board can be minimized.

Figure 9C:
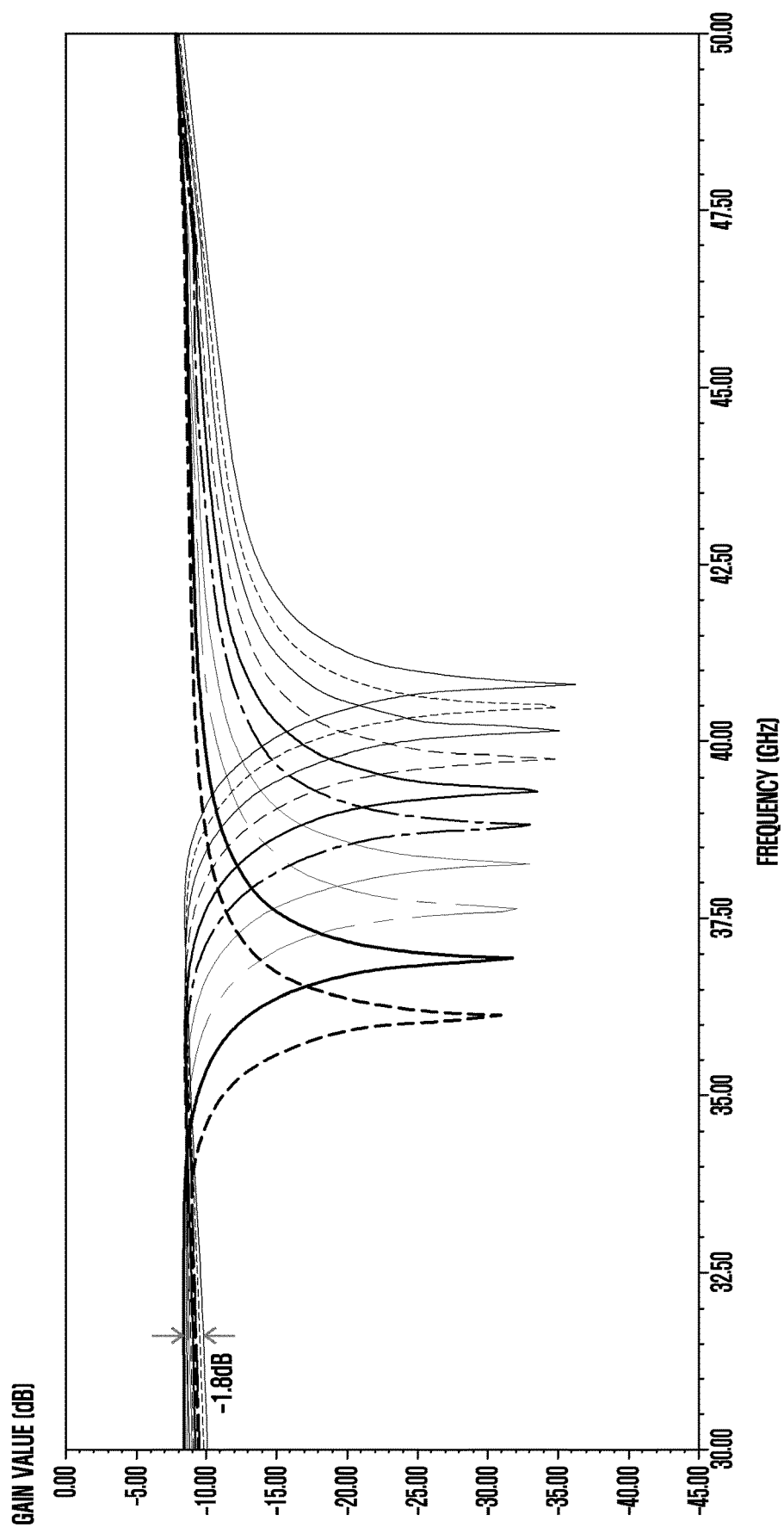
FIG. 9C is a graph illustrating the deterioration degree of a gain value in accordance with a distance between coupling pads in an antenna module structure including a first dielectric layer according to an embodiment of the disclosure.

FIG. 9C is a graph illustrating the deterioration degree of a gain value in accordance with a distance between coupling pads in an antenna module structure including a first dielectric layer according to an embodiment of the disclosure.

The graph illustrated in FIG. 9C is a graph illustrating s parameters in accordance with distance errors between the plurality of feeding pads and the plurality of feeding pads formed on the printed circuit board in the case where a first dielectric layer is deployed between the plurality of feeding pads formed on the flexible printed circuit board and the plurality of feeding pads formed on the printed circuit board. More specifically, in the same manner as the graph of FIG. 9A, the graph of FIG. 9C is a graph illustrating the deterioration degree of the gain value in accordance with the frequency in the case where the distance errors between the plurality of feeding pads formed on the flexible printed circuit board and the plurality of feeding pads formed on the printed circuit board are formed in the range of 0 to 100 µm at an interval of 10 µm.

According to an embodiment, permittivity of the first dielectric layer applied in a simulation illustrated in the graph of FIG. 9C may be about 5.5. According to the graph of FIG. 9C, in the case where the distance errors between the plurality of feeding pads formed on the flexible printed circuit board and the plurality of feeding pads formed on the printed circuit board in a specific frequency (e.g., 32.5 GHz) are 100 µm, it can be identified that the gain value deterioration of about 1.8 dB occurs in comparison with a case of no distance error.

That is, by deploying the dielectric layer having a specific permittivity between the flexible printed circuit board and the printed circuit board through comparison of the graph illustrated in FIG. 9A and the graph illustrated in FIG. 9C, it can be identified that the gain value deterioration of the antenna module is reduced.

Figure 9D:
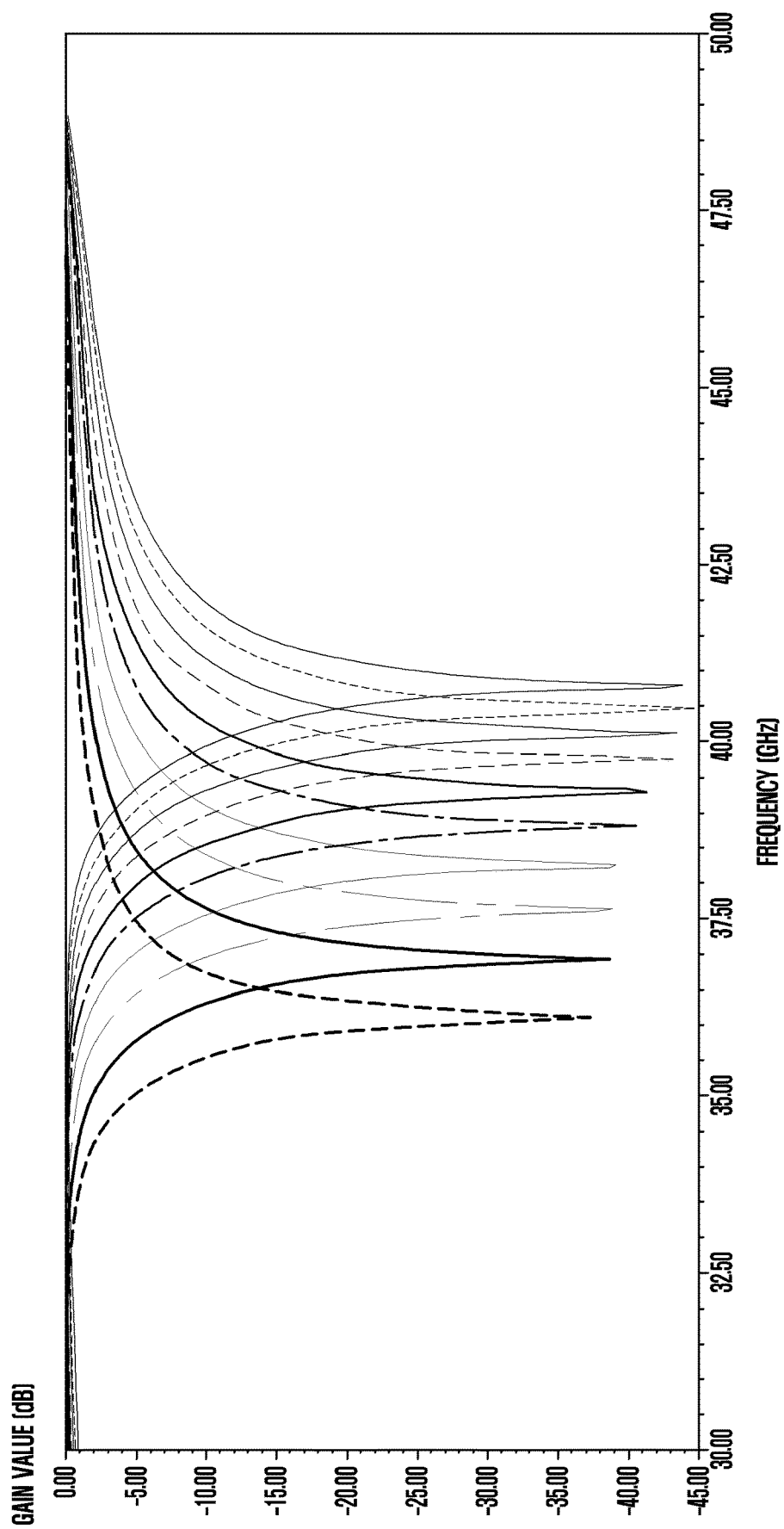
FIG. 9D is a graph illustrating the deterioration degree of a gain value in accordance with a distance between coupling pads in an antenna module structure including a second dielectric layer according to an embodiment of the disclosure.

FIG. 9D is a graph illustrating the deterioration degree of a gain value in accordance with a distance between coupling pads in an antenna module structure including a second dielectric layer according to an embodiment of the disclosure.

The graph illustrated in FIG. 9D is a graph illustrating s parameters in accordance with distance errors between the plurality of feeding pads and the plurality of feeding pads formed on the printed circuit board in the case where a second dielectric layer is deployed between the plurality of feeding pads formed on the flexible printed circuit board and the plurality of feeding pads formed on the printed circuit board. More specifically, in the same manner as the graph of FIG. 9A, the graph of FIG. 9D is a graph illustrating the deterioration degree of the gain value in accordance with the frequency in the case where the distance errors between the plurality of feeding pads formed on the flexible printed circuit board and the plurality of feeding pads formed on the printed circuit board are formed in the range of 0 to 100 µm at an interval of 10 µm.

According to an embodiment, permittivity of the second dielectric layer applied in a simulation illustrated in the graph of FIG. 9D may be about 10. According to the graph of FIG. 9D, in the case where the distance errors between the plurality of feeding pads formed on the flexible printed circuit board and the plurality of feeding pads formed on the printed circuit board in a specific frequency (e.g., 32.5 GHz) are 100 µm, it can be identified that the gain value deterioration of about 0.5 dB occurs in comparison with a case of no distance error.

That is, by deploying the dielectric layer having a specific permittivity between the flexible printed circuit board and the printed circuit board through comparison of the graph illustrated in FIG. 9A and the graph illustrated in FIG. 9D, it can be identified that the gain value deterioration of the antenna module is reduced. Further, through comparison of the graphs disclosed in FIGS. 9B to 9D, it can be identified that the gain value deterioration of the antenna module is reduced as the dielectric material having high permittivity is deployed between the flexible printed circuit board and the printed circuit board.

Figure 10A:
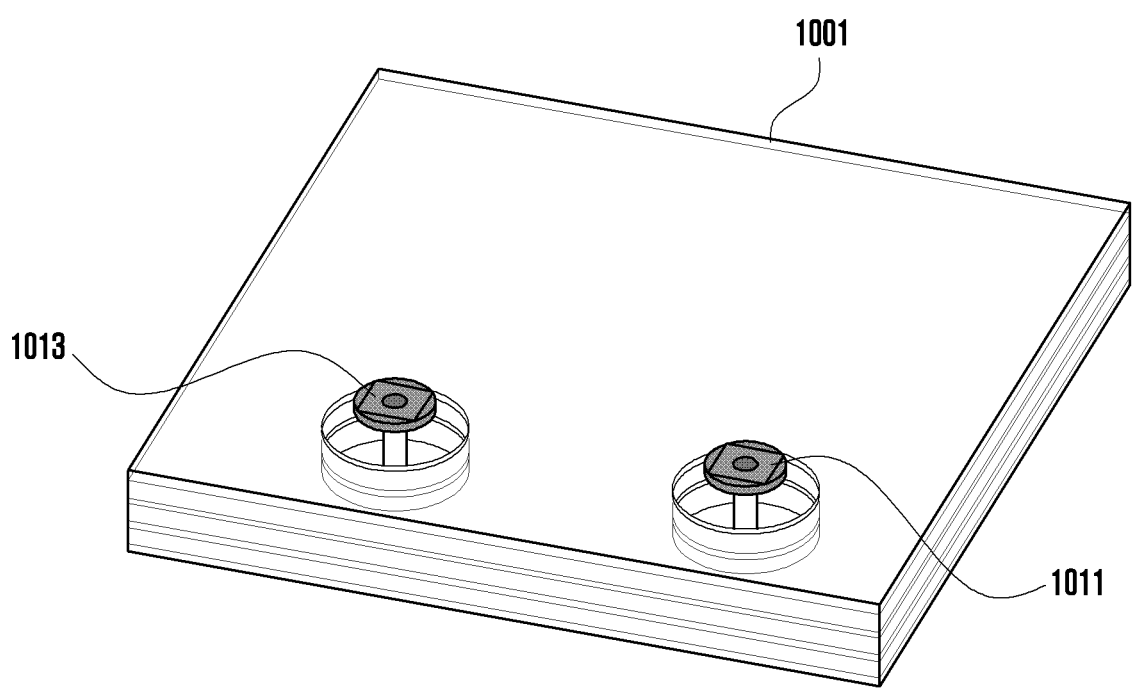
FIG. 10A is a diagram illustrating a printed circuit board to which a coupling method is applied according to an embodiment of the disclosure.

FIG. 10A is a diagram illustrating a printed circuit board to which a coupling method is applied according to an embodiment of the disclosure.

Referring to FIG. 10A, an antenna module may use a capacitive coupling method. According to various embodiments, on one surface of a printed circuit board 1001, a first feeding pad 1011 and a second feeding pad 1013 for supplying an electrical signal being transmitted from a wireless communication chip (not illustrated) deployed on the other surface of the printed circuit board 1001 may be deployed.

According to an embodiment, a flexible printed circuit board on which antennas are deployed may be deployed spaced apart for a predetermined length from one surface of the printed circuit board 1001. According to various embodiments, in the case where the antenna module uses a capacitive coupling method, it is most preferable to configure a distance between the printed circuit board 1001 and the flexible printed circuit board to 50 µm.

According to an embodiment, if the distance between the printed circuit board 1001 and the flexible printed circuit board is 50 µm, an error permission range of the distance between the printed circuit board 1001 and the flexible printed circuit board may be 20 µm. According to various embodiments, the error permission range may be determined within a range in which the degree of deterioration of the gain value of the antenna module is equal to or lower than 6 dB.

Figure 10B:
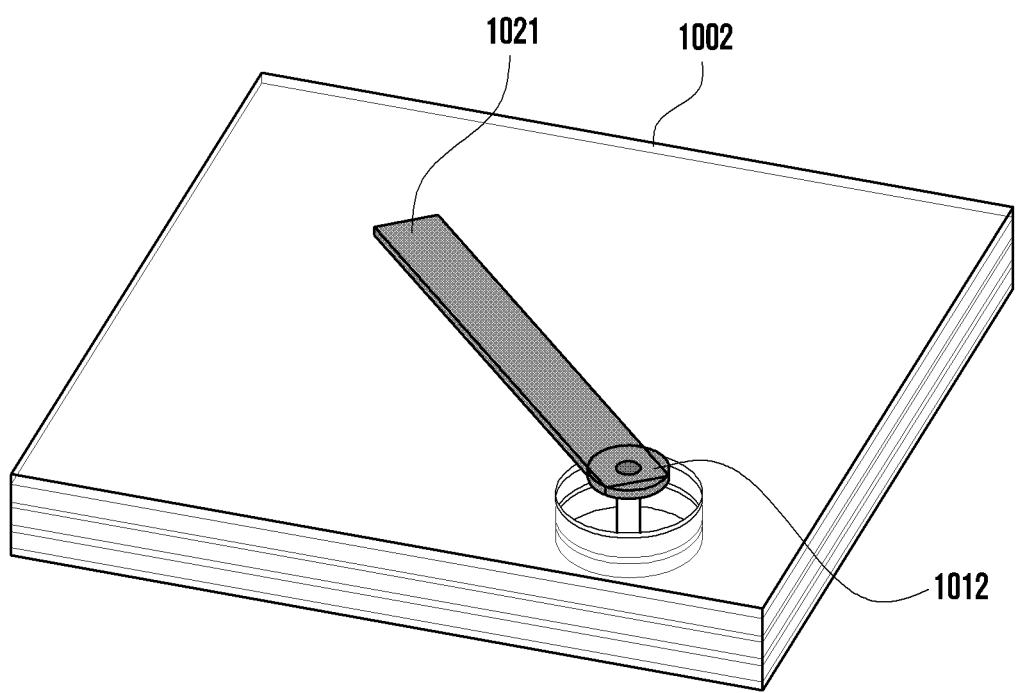
FIG. 10B is a diagram illustrating a printed circuit board to which a coupling method is applied according to an embodiment of the disclosure.

FIG. 10B is a diagram illustrating a printed circuit board to which a coupling method is applied according to an embodiment of the disclosure.

Referring to FIG. 10B, an antenna module may use a proximity coupling method. According to various embodiments, on one surface of a printed circuit board 1002, a feeding pad 1012 and a feeding line 1021 for supplying an electrical signal being transmitted from a wireless communication chip (not illustrated) deployed on the other surface of the printed circuit board 1002 may be deployed.

According to an embodiment, a flexible printed circuit board on which antennas are deployed may be deployed spaced apart for a predetermined length from one surface of the printed circuit board 1002. According to various embodiments, in the case where the antenna module uses a proximity coupling method, it is most preferable to configure a distance between the printed circuit board 1002 and the flexible printed circuit board to 50 µm.

According to an embodiment, if the distance between the printed circuit board 1002 and the flexible printed circuit board is 50 µm, an error permission range of the distance between the printed circuit board 1002 and the flexible printed circuit board may be 10 µm. According to various embodiments, the error permission range may be determined within a range in which the degree of deterioration of the gain value of the antenna module is equal to or lower than 6 dB.

Figure 10C:
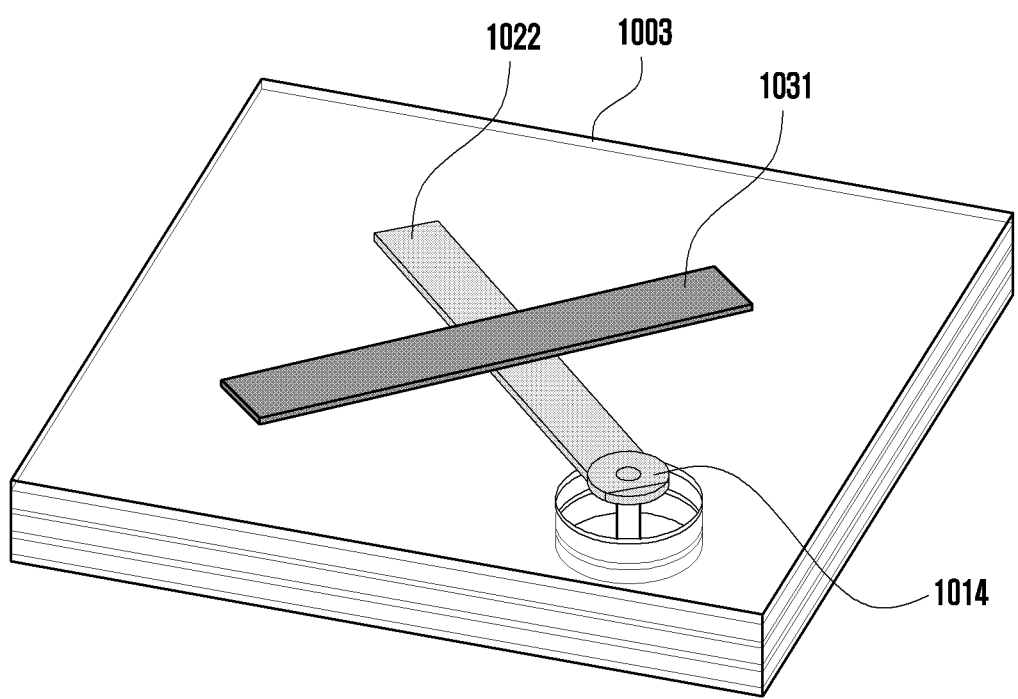
FIG. 10C is a diagram illustrating a printed circuit board to which a coupling method is applied according to an embodiment of the disclosure.

FIG. 10C is a diagram illustrating a printed circuit board to which a coupling method is applied according to an embodiment of the disclosure.

Referring to FIG. 10C, an antenna module may use an aperture coupling method (e.g., resonance coupling method). According to various embodiments, on an inside of a printed circuit board 1003, a feeding pad 1014 and a feeding line 1022 for supplying an electrical signal being transmitted from a wireless communication chip (not illustrated) deployed on the other surface of the printed circuit board 1003 may be deployed. According to various embodiments, an opening 1031 for passing an electrical signal being supplied from the feeding line 1022 therethrough may be formed on one surface of the printed circuit board 1003.

According to an embodiment, a flexible printed circuit board on which antennas are deployed may be deployed spaced apart for a predetermined length from one surface of the printed circuit board 1003. According to various embodiments, in the case where the antenna module uses the aperture coupling method, it is most preferable to configure a distance between the printed circuit board 1003 and the flexible printed circuit board to 130 µm.

According to an embodiment, if the distance between the printed circuit board 1003 and the flexible printed circuit board is 130 µm, an error permission range of the distance between the printed circuit board 1003 and the flexible printed circuit board may be 60 µm. According to various embodiments, the error permission range may be determined within a range in which the degree of deterioration of the gain value of the antenna module is equal to or lower than 6 dB.

Referring to FIGS. 10A to 10C, it can be identified that the distance between the pads for coupling (e.g., distance between the pad formed on the flexible printed circuit board on which antennas are deployed and the pad formed on the printed circuit board on which the wireless communication chip is deployed) in the antenna module structure according to the disclosure is determined based on the coupling method or the frequency (or wavelength) of radio waves to be radiated through an antenna.

Figure 11:
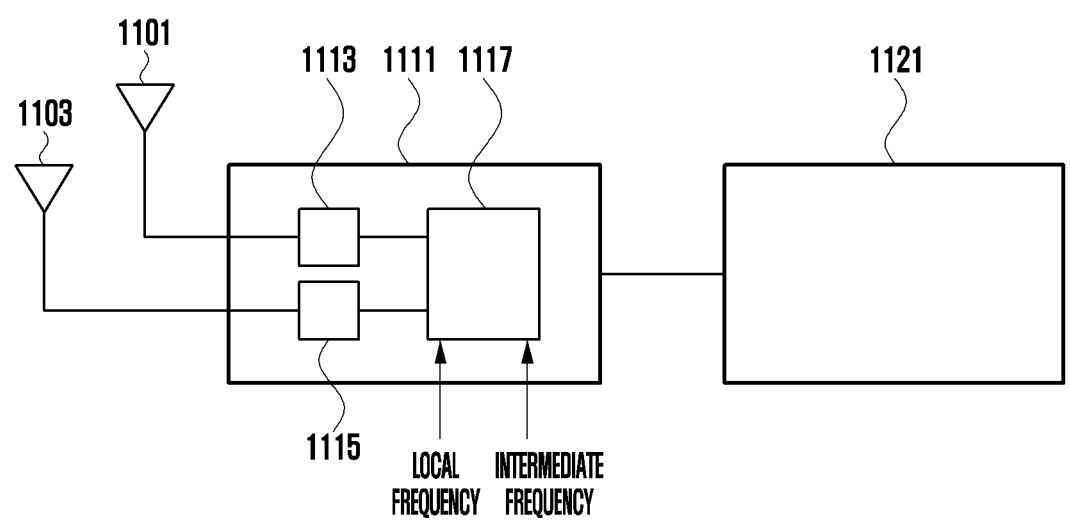
FIG. 11 is a diagram explaining a beamforming operation being performed in an antenna module structure according to an embodiment of the disclosure.

FIG. 11 is a diagram explaining a beamforming operation being performed in an antenna module structure according to an embodiment of the disclosure.

Referring to FIG. 11, an antenna module may include a first antenna 1101 forming a first radiation region in a first direction, a second antenna 1103 forming a second radiation region in a second direction, a wireless communication chip 1111 configured to supply a radio frequency signal to the first antenna 1101 and the second antenna 1103, and a modem 1121 configured to transmit a baseband signal for creating the radio frequency to the wireless communication chip 1111.

According to an embodiment, the modem 1121 may transmit a control signal for beamforming to the wireless communication chip 1111. According to various embodiments, the wireless communication chip 1111 may transmit the radio frequency signal having a specific phase to the first antenna 1101 and the second antenna 1103 based on the control signal.

According to an embodiment, the wireless communication chip 1111 may include a first phase shifter 1113 corresponding to the first antenna 1101 and a second phase shifter 1115 corresponding to the second antenna 1103. According to various embodiments, the wireless communication chip 1111 may control the first phase shifter 1113 to control the first antenna 1101 to perform beamforming in the first direction based on the control signal. For example, if the modem 1121 transmits a first digital signal of a specific bit to the wireless communication chip 1111, the wireless communication chip 1111 having received the first digital signal may adjust the phase of the first phase shifter 1113 so that the first antenna 1101 forms a beam at a specific angle (e.g., 50°).

According to an embodiment, the wireless communication chip 1111 may control the second phase shifter 1115 to control the second antenna 1103 to perform beamforming in the second direction based on the control signal. For example, if the modem 1121 transmits a second digital signal of a specific bit to the wireless communication chip 1111, the wireless communication chip 1111 having received the second digital signal may adjust the phase of the second phase shifter 1115 so that the second antenna 1103 forms a beam at a specific angle (e.g., 70°).

According to an embodiment, the wireless communication chip 1111 may include a mixer 1117 configured to generate radio frequency components based on a local frequency signal and an intermediate frequency signal. According to various embodiments, the wireless communication chip 1111 may include an analog-to-digital converter (ADC) for converting an analog signal received from the first antenna 1101 or the second antenna 1103 into a digital signal or a digital-to-analog converter (DAC) for converting a digital signal received from the modem 1121 into an analog signal.

Figure 12:
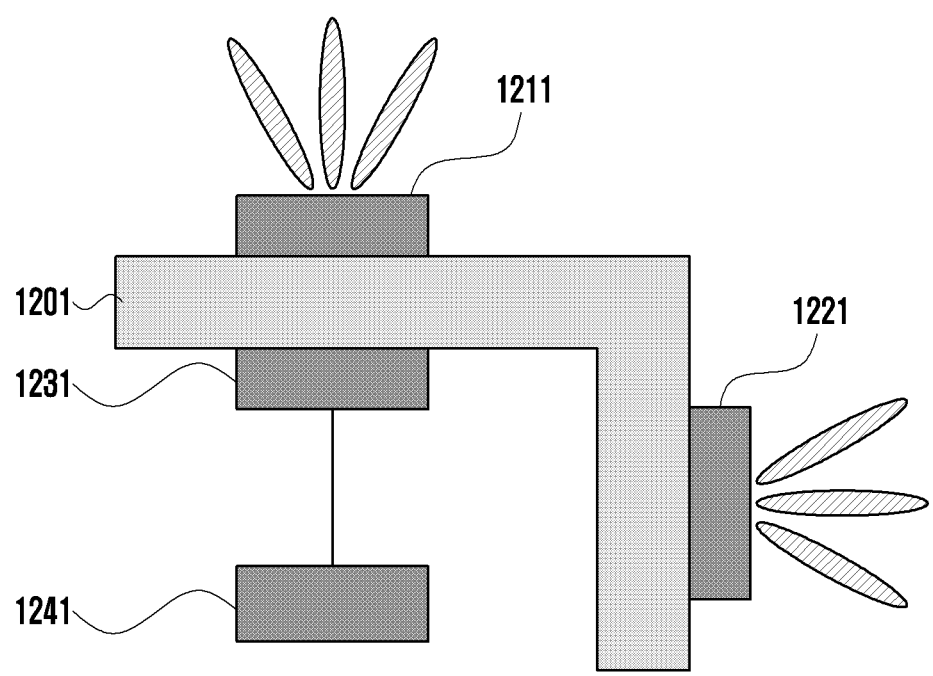
FIG. 12 is a diagram illustrating the structure of an antenna module including a wireless communication chip and a modem according to an embodiment of the disclosure.

FIG. 12 is a diagram illustrating the structure of an antenna module including a wireless communication chip and a modem according to an embodiment of the disclosure.

Referring to FIG. 12, an antenna module may include a flexible printed circuit board 1201 including a first surface directed in a first direction and a second surface directed in a second direction that forms a predetermined first angle with respect to the first direction, a first antenna 1211 deployed on one surface of the first surface and configured to form a first radiation region in a third direction, a second antenna 1221 deployed on one surface of the second surface and configured to form a second radiation region in a fourth direction, a wireless communication chip 1231 deployed on the other surface of the flexible printed circuit board 1201 and configured to supply a radio frequency signal to the first antenna 1211 and the second antenna 1221, and a modem 1241 configured to transmit a baseband signal for creating a radio frequency to the wireless communication chip 1231.

According to an embodiment, the modem 1241 may transmit a control signal for beamforming to the wireless communication chip 1231. According to various embodiments, the wireless communication chip 1231 may transmit a radio frequency signal having a specific phase to the first antenna 1211 and the second antenna 1221 based on the control signal.

According to an embodiment, the wireless communication chip 1231 may include a first phase shifter corresponding to the first antenna 1211 and a second phase shifter corresponding to the second antenna 1221. According to various embodiments, the wireless communication chip 1231 may control the first phase shifter based on the control signal so that the first antenna 1211 performs beamforming in the third direction. For example, if the modem 1241 transmits a first digital signal of a specific bit to the wireless communication chip 1231, the wireless communication chip 1231 having received the first digital signal may adjust the phase of the first phase shifter so that the first antenna 1211 forms beams at a specific angle (e.g., 50°).

According to an embodiment, the wireless communication chip 1231 may control the second phase shifter based on the control signal so that the second antenna 1221 performs beamforming in the fourth direction. For example, if the modem 1241 transmits a second digital signal of a specific bit to the wireless communication chip 1231, the wireless communication chip 1231 having received the second digital signal may adjust the phase of the second phase shifter so that the second antenna 1221 forms beams at a specific angle (e.g., 70°).

According to an embodiment, the wireless communication chip 1231 may include a mixer configured to generate radio frequency components based on a local frequency signal and an intermediate frequency signal. According to various embodiments, the wireless communication chip 1231 may include an analog-to-digital converter (ADC) for converting an analog signal received from the first antenna 1211 or the second antenna 1221 into a digital signal or a digital-to-analog converter (DAC) for converting a digital signal received from the modem 1241 into an analog signal.

According to an embodiment, an antenna module may include a flexible printed circuit board (FPCB) including a first surface directed in a first direction and a second surface directed in a second direction that forms a predetermined first angle with respect to the first direction, a first antenna deployed on one surface of the first surface and configured to form a first radiation region in a third direction, and a second antenna deployed on one surface of the second surface and configured to form a second radiation region in a fourth direction.

According to an embodiment, at least a partial region of the first radiation region and at least a partial region of the second radiation region may not overlap each other.

According to an embodiment, the antenna module may further include a controller electrically connected to the first antenna and the second antenna and configured to control radiation directions of radio waves being radiated through the first antenna and the second antenna, wherein the controller is configured to control the first antenna to perform beamforming with respect to the first radiation region and to control the second antenna to perform beamforming with respect to the second radiation region.

According to an embodiment, the antenna module may further includes a first feeding pad deployed on the other surface of the first surface, a first feeding line configured to electrically connect the first feeding pad and the first antenna to each other in the flexible printed circuit board, a second feeding pad deployed on the other surface of the first surface, and a second feeding line configured to electrically connect the second feeding pad and the second antenna to each other in the flexible printed circuit board.

According to an embodiment, the antenna module may further include a printed circuit board having one surface deployed spaced apart for a predetermined first length from the other surface of the first surface and at least one layer laminated therein, a third feeding pad deployed on the one surface of the printed circuit board corresponding to the first feeding pad, and a fourth feeding pad deployed on the one surface of the printed circuit board corresponding to the second feeding pad.

According to an embodiment, the first length may be determined based on a wavelength of radio waves being radiated through the first antenna or the second antenna.

According to an embodiment, the first length may be equal to or larger than 5 μm and is equal to or smaller than 500 μm.

According to an embodiment, the antenna module may further include a wireless communication chip deployed on the other surface of the printed circuit board, a third feeding line configured to electrically connect the wireless communication chip and the third feeding pad to each other in the printed circuit board, and a fourth feeding line configured to electrically connect the wireless communication chip and the fourth feeding pad to each other in the printed circuit board.

According to an embodiment, the antenna module may further include a film layer deployed between the other surface of the first surface of the flexible printed circuit board and the one surface of the printed circuit board and configured to uniformly maintain a distance between the other surface of the first surface of the flexible printed circuit board and the one surface of the printed circuit board.

According to an embodiment, the film layer may further include an adhesive layer configured to make the other surface of the first surface of the flexible printed circuit board and the one surface of the printed circuit board adhere to each other.

According to an embodiment, the antenna module may further include a wireless communication chip having one surface deployed spaced apart for a predetermined second length from the other surface of the first surface, a third feeding pad deployed on one surface of the wireless communication chip corresponding to the first feeding pad, and a fourth feeding pad deployed on the one surface of the wireless communication chip corresponding to the second feeding pad.

According to the antenna module according to an embodiment, the flexible printed circuit board may include a first layer deployed on an upper end surface thereof and a second layer deployed under the first layer, and the first antenna may be deployed on the one surface of the first surface directed in the first direction on the first layer, the second antenna may be deployed on the one surface of the second surface directed in the second direction on the first layer, and a third antenna may be deployed on a one surface of a first surface directed in the first direction on the second layer.

According to an embodiment, the antenna module may further include a third antenna deployed on one surface of a third surface of the flexible printed circuit board directed in a third direction, wherein the third direction and the first direction form a predetermined second angle, and the third direction and the second direction form a predetermined third angle.

According to an embodiment, the first antenna or the second antenna may include at least one of a patch antenna, a monopole antenna, a spiral antenna, a wave antenna, a yagiuda antenna, a loop antenna, a Vivaldi antenna, or a holographic antenna.

According to an embodiment, an electronic device may include a front member directed in a first direction, a rear member directed in a second direction that is opposite to the first direction, a side member surrounding a space between the front member and the rear member, and an antenna module deployed in a closed space formed by the front member, the rear member, and the side member, wherein the antenna module may include a flexible printed circuit board (FPCB) including a first surface facing the front member and a second surface facing the side member, a first antenna deployed on one surface of the first surface and configured to form a first radiation region in a third direction, and a second antenna deployed on one surface of the second surface and configured to form a second radiation region in a fourth direction.

According to an embodiment, at least a partial region of the first radiation region and at least a partial region of the second radiation region may not overlap each other.

According to an embodiment, the antenna module may further include a controller electrically connected to the first antenna and the second antenna and configured to control radiation directions of radio waves being radiated through the first antenna and the second antenna, wherein the controller may be configured to control the first antenna to perform beamforming with respect to the first radiation region and to control the second antenna to perform beamforming with respect to the second radiation region.

According to an embodiment, the first radiation region may be a radiation region that is formed if radio waves are radiated through the front member or the rear member, and the second radiation region may be a radiation region that is formed if the radio waves are radiated through the side member.

According to an embodiment the antenna module may further include a first feeding pad deployed on the other surface of the first surface, a first feeding line configured to electrically connect the first feeding pad and the first antenna to each other in the flexible printed circuit board, a second feeding pad deployed on the other surface of the first surface, and a second feeding line configured to electrically connect the second feeding pad and the second antenna to each other in the flexible printed circuit board.

According to an embodiment, the antenna module may further include a printed circuit board having one surface deployed spaced apart for a predetermined first length from the other surface of the first surface and at least one layer laminated therein, a third feeding pad deployed on the one surface of the printed circuit board corresponding to the first feeding pad, and a fourth feeding pad deployed on the one surface of the printed circuit board corresponding to the second feeding pad.

According to an embodiment, the first length may be determined based on a wavelength of radio waves being radiated through the first antenna or the second antenna.

According to an embodiment, the first length may be equal to or larger than 5 µm and is equal to or smaller than 500 µm.

According to an embodiment, the antenna module may further include a wireless communication chip deployed on the other surface of the printed circuit board, a third feeding line configured to electrically connect the wireless communication chip and the third feeding pad to each other in the printed circuit board, and a fourth feeding line configured to electrically connect the wireless communication chip and the fourth feeding pad to each other in the printed circuit board.

According to an embodiment, the antenna module may further include a film layer deployed between the other surface of the first surface of the flexible printed circuit board and the one surface of the printed circuit board and configured to uniformly maintain a distance between the other surface of the first surface of the flexible printed circuit board and the one surface of the printed circuit board.

According to an embodiment, the film layer may further include an adhesive layer configured to make the other surface of the first surface of the flexible printed circuit board and the one surface of the printed circuit board adhere to each other.

According to an embodiment, the antenna module may further include a wireless communication chip having one surface deployed spaced apart for a predetermined second length from the other surface of the first surface, a third feeding pad deployed on one surface of the wireless communication chip corresponding to the first feeding pad, and a fourth feeding pad deployed on the one surface of the wireless communication chip corresponding to the second feeding pad.

According to an embodiment, the flexible printed circuit board may include a first layer deployed on an upper end surface thereof and a second layer deployed under the first layer, and the first antenna may be deployed on the one surface of the first surface directed in the first direction on the first layer, the second antenna may be deployed on the one surface of the second surface directed in the second direction on the first layer, and a third antenna may be deployed on a one surface of a first surface directed in the first direction on the second layer.

According to an embodiment, the antenna module may further include a third antenna deployed on one surface of a third surface of the flexible printed circuit board formed in a third direction, and the third direction and the first direction may form a predetermined second angle, and the third direction and the second direction may form a predetermined third angle.

According to an embodiment, the first antenna may include a broadside antenna array, and the second antenna includes an endfire antenna array.

According to an embodiment, the first antenna or the second antenna may include at least one of a patch antenna, a monopole antenna, a spiral antenna, a wave antenna, a yagiuda antenna, a loop antenna, a Vivaldi antenna, or a holographic antenna.

According to an embodiment, an antenna module may include a flexible printed circuit board (FPCB) including a first surface directed in a first direction and a second surface directed in a second direction that forms a predetermined first angle with respect to the first direction, a first antenna deployed on one surface of the first surface and configured to form a first radiation region in a third direction, a second antenna deployed on one surface of the second surface and configured to form a second radiation region in a fourth direction, a wireless communication chip deployed on the other surface of the flexible printed circuit board and configured to supply a radio frequency signal to the first antenna and the second antenna, and a modem configured to transmit a baseband signal to the wireless communication chip, wherein the modem may be configured to transmit a control signal for beamforming to the wireless communication chip, and the wireless communication chip may be configured to transmit a radio frequency signal to the first antenna and the second antenna based on the control signal.

According to an embodiment, the wireless communication chip may include a first phase shifter corresponding to the first antenna and a second phase shifter corresponding to the second antenna, the wireless communication chip may be configured to control the first phase shifter based on the control signal so that the first antenna performs beamforming in the third direction, and the wireless communication chip may be configured to control the second phase shifter based on the control signal so that the second antenna performs beamforming in the fourth direction.

According to an embodiment, the modem may be configured to transmit, to the first phase shifter, a first control signal for the first antenna to perform beamforming in the third direction, and the modem may be configured to transmit, to the second phase shifter, a second control signal for the second antenna to perform beamforming in the fourth direction According to an embodiment, the wireless communication chip may include a mixer configured to generate radio frequency components based on a local frequency signal and an intermediate frequency signal.

According to an embodiment, at least a partial region of the first radiation region and at least a partial region of the second radiation region may not overlap each other.

According to an embodiment, the antenna module may further include a first feeding pad deployed on the other surface of the first surface, a first feeding line configured to electrically connect the first feeding pad and the first antenna to each other in the flexible printed circuit board, a second feeding pad deployed on the other surface of the first surface, and a second feeding line configured to electrically connect the second feeding pad and the second antenna to each other in the flexible printed circuit board.

According to an embodiment, the antenna module may further include a printed circuit board having one surface deployed spaced apart for a predetermined first length from the other surface of the first surface and at least one layer laminated therein, a third feeding pad deployed on the one surface of the printed circuit board corresponding to the first feeding pad, and a fourth feeding pad deployed on the one surface of the printed circuit board corresponding to the second feeding pad.

According to an embodiment, the first length may be determined based on a wavelength of radio waves being radiated through the first antenna or the second antenna.

According to an embodiment, the first length may be equal to or larger than 5 μm and is equal to or smaller than 500 μm.

According to an embodiment, the wireless communication chip may be deployed on the other surface of the printed circuit board, and the antenna module may further include a third feeding line configured to electrically connect the wireless communication chip and the third feeding pad to each other in the printed circuit board, and a fourth feeding line configured to electrically connect the wireless communication chip and the fourth feeding pad to each other in the printed circuit board.

According to an embodiment, the antenna module may further include a film layer deployed between the other surface of the first surface of the flexible printed circuit board and the one surface of the printed circuit board and configured to uniformly maintain a distance between the other surface of the first surface of the flexible printed circuit board and the one surface of the printed circuit board.

According to an embodiment, the film layer may further include an adhesive layer configured to make the other surface of the first surface of the flexible printed circuit board and the one surface of the printed circuit board adhere to each other.

According to an embodiment, the wireless communication chip may have one surface deployed spaced apart for a predetermined second length from the other surface of the first surface, and the antenna module may further include a third feeding pad deployed on one surface of the wireless communication chip corresponding to the first feeding pad, and a fourth feeding pad deployed on the one surface of the wireless communication chip corresponding to the second feeding pad.

According to an embodiment, the flexible printed circuit board may include a first layer deployed on an upper end surface thereof and a second layer deployed under the first layer, and the first antenna may be deployed on the one surface of the first surface directed in the first direction on the first layer, the second antenna may be deployed on the one surface of the second surface directed in the second direction on the first layer, and a third antenna may be deployed on a one surface of a first surface directed in the first direction on the second layer.

According to an embodiment, the antenna module may further include a third antenna deployed on one surface of a third surface of the flexible printed circuit board directed in a third direction, wherein the third direction and the first direction may form a predetermined second angle, and the third direction and the second direction may form a predetermined third angle.

According to an embodiment, the first antenna or the second antenna may include at least one of a patch antenna, a monopole antenna, a spiral antenna, a wave antenna, a yagiuda antenna, a loop antenna, a Vivaldi antenna, or a holographic antenna.

According to the embodiment of the disclosure, the antennas can be efficiently deployed in diverse locations within the electronic device, and thus the gain value and the coverage of radio waves can be improved.

According to the embodiment of the disclosure, an antenna module of a wireless communication system, the antenna module may comprise: a first printed circuit board including a first surface directed in a first direction and a second surface directed in a second direction; an antenna deployed on a first area of the first surface of the first printed circuit board and configured to form a first radiation region; a second printed circuit board including a first surface deployed spaced apart for a predetermined length from the second surface of the first printed circuit board; a first feeding pad deployed on a first area of the second surface of the first printed circuit board; a first feeding line configured to electrically connect the first feeding pad and the first antenna to each other in the first printed circuit board; a second feeding pad deployed on the first surface of the second printed circuit board corresponding to the first feeding pad; a wireless communication chip deployed on a second surface of the second printed circuit board; and a second feeding line configured to electrically connect the wireless communication chip and the second feeding pad to each other in the second printed circuit board; wherein the first printed circuit board may be a flexible printed circuit board (FPCB).

According to the embodiment of the disclosure, the first length may be determined based on a wavelength of radio waves being radiated through at least one of the first antenna or the second antenna.

In addition, according to the embodiment of the disclosure, the feeding pads of the printed circuit board and the antennas are not directly connected to each other, and thus the degree of freedom of the antenna deployment design within the electronic device can be improved.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An antenna circuitry of a wireless communication system, the antenna circuitry comprising:
   a first printed circuit board including a first surface directed in a first direction and a second surface directed in a second direction that is bent at a predetermined first angle from the first surface;
   a first feeding pad and a second feeding pad disposed on a third surface of the first printed circuit board opposite to the first surface, the first feeding pad being separate from the second feeding pad;
   a first antenna disposed on the first surface of the first printed circuit board and forming a first radiation region in a third direction;
   a second antenna disposed on the second surface of the first printed circuit board and forming a second radiation region in a fourth direction;
   a first feeding line electrically connecting the first feeding pad to the first antenna in the first printed circuit board by extending from the third surface to the first surface of the first printed circuit board; and
   a second feeding line electrically connecting the second feeding pad to the second antenna in the first printed circuit board by extending from the third surface to the second surface of the first printed circuit board; and
   circuitry free from being physically connected to the first printed circuit board, the circuitry being separated from the first printed circuit board by a predetermined first length based on at least one feeding method of capacitive coupling, inductive coupling, or resonant coupling,
   wherein the circuitry feeds a radio frequency signal to the first printed circuit board according to the at least one feeding method, and
   wherein the first printed circuit board comprises a flexible printed circuit board (FPCB).

2. The antenna circuitry of claim 1, wherein at least a partial region of the first radiation region and at least a partial region of the second radiation region do not overlap each other.

3. The antenna circuitry of claim 1, further comprising:
   a processor electrically connected to the first antenna and the second antenna, the processor being configured to:
   control radiation directions of radio waves being radiated through the first antenna and the second antenna,
   control the first antenna to perform beamforming with respect to the first radiation region, and
   control the second antenna to perform beamforming with respect to the second radiation region.

4. The antenna circuitry of claim 1, wherein the circuitry comprises:
   a second printed circuit board comprising:
      a first surface spaced apart for the first length from the third surface of the first printed circuit board, and
      at least one layer laminated therein;
   a third feeding pad disposed on the first surface of the second printed circuit board corresponding to the first feeding pad; and
   a fourth feeding pad disposed on the first surface of the second printed circuit board corresponding to the second feeding pad.

5. The antenna circuitry of claim 1, wherein the first length is determined based on a wavelength of radio waves being radiated through at least one of the first antenna or the second antenna.

6. The antenna circuitry of claim 1, wherein the first length is equal to or larger than 5 μm or equal to or smaller than 500 μm.

7. The antenna circuitry of claim 4, further comprising:
   a wireless communication chip disposed on a second surface of the second printed circuit board;
   a third feeding line electrically connecting the wireless communication chip to the third feeding pad in the second printed circuit board; and
   a fourth feeding line electrically connecting the wireless communication chip to the fourth feeding pad in the second printed circuit board.

8. The antenna circuitry of claim 4, further comprising:
   a film layer disposed between the third surface of the first printed circuit board and the first surface of the second printed circuit board,
   wherein the film layer uniformly maintains a distance between the third surface of the first printed circuit board and the first surface of the second printed circuit board.

9. The antenna circuitry of claim 8, wherein the film layer comprises an adhesive layer adhering the third surface of the first printed circuit board to the first surface of the second printed circuit board.

10. The antenna circuitry of claim 1, wherein the circuitry comprises:
    a wireless communication chip comprising a first surface spaced apart a predetermined second length from the third surface of the first printed circuit board;

a third feeding pad disposed on the first surface of the wireless communication chip corresponding to the first feeding pad; and a fourth feeding pad disposed on the first surface of the wireless communication chip corresponding to the second feeding pad.

11. The antenna circuitry of claim 1,
wherein the first printed circuit board comprises a first layer disposed on an upper end surface thereof and a second layer disposed under the first layer,
wherein the first antenna is disposed on the first surface facing the first direction on the first layer of the first printed circuit board,
wherein the second antenna is disposed on the second surface facing the second direction on the first layer of the first printed circuit board, and
wherein a third antenna is disposed on a surface facing the first direction on the second layer of the first printed circuit board.

12. The antenna circuitry of claim 1, further comprising:
a third antenna disposed on a surface of the first printed circuit board facing a third direction,
wherein the third direction and the first direction form a predetermined second angle, and
wherein the third direction and the second direction form a predetermined third angle.

13. The antenna circuitry of claim 1, wherein at least one of the first antenna or the second antenna comprises at least one of a patch antenna, a monopole antenna, a spiral antenna, a wave antenna, a yagiuda antenna, a loop antenna, a Vivaldi antenna, or a holographic antenna.

14. The antenna circuitry of claim 1, wherein the circuitry comprises:
a wireless communication chip supplying the radio frequency signal to the first antenna and the second antenna; and
a modem transmitting a baseband signal to the wireless communication chip,
wherein the modem transmits a control signal for beamforming to the wireless communication chip, and
wherein the wireless communication chip transmits the radio frequency signal to the first antenna and the second antenna based on the control signal.

15. The antenna circuitry of claim 14,
wherein the wireless communication chip comprises a first phase shifter corresponding to the first antenna and a second phase shifter corresponding to the second antenna, and
wherein the wireless communication chip controls the first phase shifter based on the control signal so that the first antenna performs beamforming in the third direction, and controls the second phase shifter based on the control signal so that the second antenna performs beamforming in the fourth direction.

16. The antenna circuitry of claim 15,
wherein the modem transmits, to the first phase shifter, a first control signal for the first antenna to perform beamforming in the third direction, and
wherein the modem transmits, to the second phase shifter, a second control signal for the second antenna to perform beamforming in the fourth direction.

17. The antenna circuitry of claim 14, wherein the wireless communication chip comprises a mixer generating radio frequency components based on a local frequency signal and an intermediate frequency signal.

18. The antenna circuitry of claim 1, wherein the second feeding line extending from the third surface to the second surface of the first printed circuit board is bent at the predetermined first angle.

* * * * *